(12) United States Patent
Kitahara

(10) Patent No.: US 6,732,414 B2
(45) Date of Patent: May 11, 2004

(54) METHOD OF MANUFACTURING A LIQUID INK JET HEAD

(75) Inventor: Tsuyoshi Kitahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/748,104

(22) Filed: Dec. 27, 2000

(65) Prior Publication Data

US 2001/0052738 A1 Dec. 20, 2001

(30) Foreign Application Priority Data

Dec. 27, 1999 (JP) .......................... P. 11-371175
Jan. 24, 2000 (JP) ....................... P.2000-017886

(51) Int. Cl.⁷ .............................................. H04R 17/00
(52) U.S. Cl. ..................... 29/25.35; 29/593; 29/890.1; 216/26; 216/27; 347/19; 347/68; 347/70; 347/71; 347/72
(58) Field of Search ................. 29/25.35, 593, 29/890.1; 347/19, 68, 70, 71, 72; 310/328; 216/26, 27

(56) References Cited

U.S. PATENT DOCUMENTS

| | | | | |
|---|---|---|---|---|
| 5,548,314 A | * | 8/1996 | Okazawa et al. | ............. 347/71 |
| 5,548,894 A | * | 8/1996 | Muto | ........................... 29/890 |
| 5,930,895 A | * | 8/1999 | Orikasa et al. | ............. 29/890.1 |
| 6,149,264 A | * | 11/2000 | Hirabayashi et al. | ......... 347/43 |
| 6,164,772 A | * | 12/2000 | Koitabashi et al. | ......... 347/100 |
| 6,338,545 B1 | * | 1/2002 | Sekiya | ........................ 347/47 |

FOREIGN PATENT DOCUMENTS

| | | | |
|---|---|---|---|
| JP | 6-91867 | 4/1994 | |
| JP | 6-312505 | 11/1994 | |
| JP | 7-178902 | 7/1995 | ............ B41J/2/045 |
| JP | 9-300636 | 11/1997 | .............. B41J/2/16 |
| JP | 10-193601 | 7/1998 | |
| JP | 10-226080 | 8/1998 | |
| JP | 10-278262 | 10/1998 | |
| JP | 11-138812 | 5/1999 | |
| JP | 11342610 | * 12/1999 | |

* cited by examiner

Primary Examiner—Peter Vo
Assistant Examiner—Paul D Kim
(74) Attorney, Agent, or Firm—Sughrue Mion, PLLC

(57) ABSTRACT

A manufacturing method of manufacturing a liquid jet head which has a plurality of piezoelectric vibrators, each having, at least in part, a laminate structure of electrodes and at least one layer of piezoelectric material. An ejection characteristic measurement step applies a similar drive signal to all of the piezoelectric vibrators to eject liquid from the nozzle openings. The liquid ejection characteristics are measured in a one-by-one basis of the nozzle openings. An ejection characteristic adjustment step sets a treatment condition for at least one of the piezoelectric vibrators based on a result of measurement by the ejection characteristic measurement step. At least one piezoelectric vibrator is subjected to a displacement amount adjustment based on the set treatment condition by trimming away a portion of an external electrode, thereby making the liquid ejection characteristic associated with the nozzle openings uniform.

4 Claims, 10 Drawing Sheets

EFFECTIVE LENGTH OF
EXTERNAL ELECTRODE

METHOD OF MANUFACTURING A LIQUID INK JET HEAD

BACKGROUND OF THE INVENTION

This invention relates to a liquid jet unit used in an industrial machine, such as a manufacturing machine for manufacturing optical filters, and an image recording apparatus such as a plotter and a printer, and a piezoelectric vibrator unit used in the liquid jet unit. This invention also relates to methods of manufacturing the liquid jet unit and the piezoelectric vibrator unit.

Industrial machines such as manufacturing machines and image recording apparatuses such as plotters and printers are available, which employ a liquid jet head for ejecting liquid in the form of liquid droplets. For example, an industrial machine for manufacturing an optical filter is designed to eject color material in the form of liquid droplets onto a filter substrate using an ejection head (a kind of liquid jet head). An image recording apparatus is designed to eject ink droplets from a recording head (a kind of liquid jet head) onto a printing or recording medium such as paper.

These industrial machines and image recorders require high accuracy for the amount and speed of the ejected liquid droplets. For example, the optical filter manufacturing machine must eject a proper amount (i.e. a proper ejection amount) of an color material droplet onto a proper position with high accuracy since the optical filter manufactured with the industrial machine is used with a liquid crystal display, etc. The image recording apparatus requires high accuracy as to a position onto which an ink droplet is ejected, and an amount of the ejected ink, in order to improve image quality and speed up the recording.

The liquid jet head, widely used in these industrial machines and image recording apparatuses, typically includes: a flow passage unit formed with a plurality of ink flow passages each extending from a reservoir through a pressure chamber to a nozzle opening; and a piezoelectric vibrator unit being placed on the rear of the flow passage unit and having a plurality of piezoelectric vibrators provided in a one-to-one correspondence with the pressure chambers for changing the volumes of the corresponding pressure chambers. The liquid jet head ejects liquid from a nozzle opening by changing the volume of the corresponding pressure chamber using deformation (displacement) of the corresponding piezoelectric vibrator.

The piezoelectric vibrator unit is manufactured, for example, according to the following procedure: First, common internal electrodes and segment internal electrodes are laminated alternately with a piezoelectric material interposed between adjacent internal electrodes to manufacture a plate-like laminated substrate, and a common external electrode electrically conducted to the common internal electrodes and a segment external electrodes electrically conducted to the segment internal electrodes are formed on the surface of the laminated substrate to obtain a laminated member. After the base end side portion of the laminated member is fixed to a fixing plate, the leading end side portion of the laminated member is cut into a plurality of segments (piezoelectric vibrators) each having an extremely narrow width of about 50 $\mu$m to 100 $\mu$m using a wire saw, a dicing saw, etc.

The piezoelectric vibrator unit thus manufactured is disposed in a state in which the displaceable surfaces of piezoelectric vibrators are contacted with diaphragm parts for the pressure chambers, respectively.

Another type of the liquid jet head has piezoelectric vibrators that are provided in the diaphragm parts for the pressure chambers, respectively. The liquid jet head of this type ejects liquid from a nozzle opening by changing the volume of the corresponding pressure chamber using deformation (displacement) of the corresponding piezoelectric vibrator similarly.

The liquid jet head using the piezoelectric vibrator unit has an advantage in that piezoelectric vibrators having identical displacement characteristic can be easily obtained because the piezoelectric vibration unit is manufactured such that the laminated member is cut to provide the piezoelectric vibrators. Namely, a come-like piezoelectric vibrator is provided by cutting substantially the same piezoelectric vibrator unit. Therefore, since it is substantially the same one first, the variation in the characteristic between each piezoelectric vibrator is small. However, each piezoelectric vibrator obtained as a consequence of cutting has an extremely narrow width, and therefore slight variation in width may occur. Since the piezoelectric vibrator is of laminated type, if a pinhole larger than the width of the piezoelectric vibrator exists in the internal electrode, the internal electrode is brought partially out of electric conduction by the presence of the pinhole. In the case of the industrial machine of which especially high precision is required, even if it is the small piezoelectric vibrator of variation, the small highly precise characteristic of variation is demanded more than it. Thus, the width variation of the piezoelectric vibrators, the defect of the internal electrode, and the like cause the piezoelectric vibrators to have sight varied displacement amounts.

In the case of the liquid jet head in which the piezoelectric vibrators are provided in the diaphragm parts for the pressure chambers, the thickness, shape, etc., of piezoelectric material is likely to be varied, and thus the displacement amounts of the piezoelectric vibrators are varied largely in comparison to the case where the piezoelectric vibrators constitute the piezoelectric vibrator unit.

Such displacement amount variation of the piezoelectric vibrators adversely affect the liquid ejection characteristic of the liquid jet head and thus is not preferable. For example, in the case of the optical filter manufacturing machine, the sizes of pixels forming the optical filter are varied depending on the respective nozzle openings, and in the case of the image recording apparatus, the pixels deposited onto a recording medium are made non-uniform in size.

Further, the liquid ejection characteristic of the liquid jet head is also changed due to the attachment state of the vibrator unit to the flow passage unit and the shape of the ink flow passage in the flow passage unit.

To prevent these problems, it is conceivable to fill one scanning line with liquid droplets ejected from a plurality of nozzle openings, but this will lower the throughput since the liquid jet head needs to be scanned plural times to fill one scanning line.

This is particularly not preferable for the industrial machines since the lowered throughput results in lowered production efficiency and thus increased cost of the product.

SUMMARY OF THE INVENTION

The present invention was made in order to solve the above-mentioned problems, and an object of the present invention is to make uniform the displacement amounts of piezoelectric vibrators, and to thereby make uniform the liquid ejection characteristic of a liquid jet head.

According to the present invention, one or more of piezoelectric vibrators, which will cause variation in liquid ejection characteristic, is subjected to a displacement amount adjustment treatment to make uniform the displacement amounts of piezoelectric vibrators.

The present invention provides the followings:

(1) A manufacturing method of manufacturing a piezoelectric vibrator unit comprising a plurality of piezoelectric vibrators, each having, at least in part, a laminate structure of electrodes and at least one layer of piezoelectric material, said manufacturing method comprising:

a displacement amount measurement step of measuring a displacement amount of each of the piezoelectric vibrators with respect to a reference voltage; and a displacement amount adjustment step of setting a treatment condition for at least one of the piezoelectric vibrators based on a result of measurement by the displacement amount measurement step, and subjecting the at least one of the piezoelectric vibrators to a displacement amount adjustment based on the thus set treatment condition, thereby making the displacement amounts of the piezoelectric vibrators uniform.

(2) The manufacturing method of (1), wherein:

the laminate structure includes an external electrode as an outermost one of the electrodes in a laminate direction, and an internal electrode that is to be different in polarity from the external electrode and that is confronted with the external electrode through a layer of the piezoelectric material to form an active region, the displacement amount adjustment includes a step of trimming a portion of the external electrode of the at least one piezoelectric vibrator, the portion being located within the active region.

(3) The manufacturing method of (2), wherein the displacement amount adjustment step includes setting a piezoelectric vibrator having the smallest displacement amount with respect to the reference voltage as a reference vibrator, and adjusting the displacement amounts of the piezoelectric vibrators, other than the reference vibrator, to be identical to the displacement amount of the reference vibrator.

(4) The manufacturing method of (2), wherein said displacement amount adjustment step includes setting a piezoelectric vibrator having the smallest displacement amount with respect to the reference voltage as a reference vibrator, and adjusting the displacement amounts of all the piezoelectric vibrators to be identical to a target displacement amount smaller than the displacement amount of the reference vibrator.

(5) The manufacturing method of any one of (2) to (4), wherein the step of trimming includes trimming the portion of the external electrode using laser beam.

(6) The manufacturing method of any one of (2) to (5), further comprising:

laminating piezoelectric material layers and internal electrode layers alternately to provide a laminate substrate;

forming an external electrode layer on at least a surface of the laminate substrate to provide a laminate member; and at least partially cutting the laminate member to provide the piezoelectric vibrators in the form of teeth of comb.

(7) The manufacturing method of (1), further comprising a semi-saturation polarization treatment step, executed prior to the displacement amount measurement step, of polarizing the piezoelectric material to put the piezoelectric material into a semi-saturation polarization state, not into a saturation polarization state, and wherein the displacement amount adjustment includes a re-polarization treatment step of re-polarizing the piezoelectric material of the at least one piezoelectric vibrator in a direction from the semi-saturation polarization state toward the saturation polarization state.

(8) The manufacturing method of (7), wherein the displacement amount adjustment step includes setting a piezoelectric vibrator having the largest displacement amount with respect to the reference voltage as a reference vibrator, and adjusting the displacement amounts of the piezoelectric vibrators, other than the reference vibrator, to be identical to the displacement amount of the reference vibrator.

(9) The manufacturing method of (7), wherein the displacement amount adjustment step includes setting a piezoelectric vibrator having the largest displacement amount with respect to the reference voltage as a reference vibrator, and adjusting the displacement amounts of all the piezoelectric vibrators to be identical to a target displacement amount larger than the displacement amount of the reference vibrator.

(10) The manufacturing method of any one of (7) to (9), wherein the semi-saturation polarization state is set to be 90% of the saturation polarization state.

(11) The manufacturing method of any one of (7) to (10), wherein at least one of the semi-saturation polarization treatment step and the re-polarization treatment step uses a voltage value applied to the piezoelectric material as a variable, and adjusts the voltage value to obtain a desired degree of polarization.

(12) The manufacturing method of any one of (7) to (11), wherein at least one of the semi-saturation polarization treatment step and the re-polarization treatment step uses a time period, for which a voltage is applied to the piezoelectric material, as a variable, and adjusts the time period to obtain a desired degree of polarization.

(13) The manufacturing method of any one of (7) to (12), wherein at least one of the semi-saturation polarization treatment step and the re-polarization treatment step uses a temperature of the piezoelectric material as a variable, and adjusts the temperature to obtain a desired degree of polarization.

(14) The manufacturing method of (1), further comprising:

a saturation polarization treatment step, executed prior to the displacement amount measurement step, of polarizing the piezoelectric material to put the piezoelectric material into a saturation polarization state, wherein the displacement amount adjustment includes a spot heating treatment step of locally heating the piezoelectric material of the at least one piezoelectric vibrator in a direction away from the saturation polarization state.

(15) The manufacturing method of (14), wherein the displacement amount adjustment step includes setting a piezoelectric vibrator having the smallest displacement amount with respect to the reference voltage as a reference vibrator, and adjusting the displacement amounts of the piezoelectric vibrators, other than the reference vibrator, to be identical to the displacement amount of the reference vibrator.

(16) The manufacturing method of (14), wherein the displacement amount adjustment step includes setting a piezoelectric vibrator having the smallest displacement amount with respect to the reference voltage as a reference vibrator, and adjusting the displacement amounts of all the piezoelectric vibrators to be identical to a target displacement amount smaller than the displacement amount of the reference vibrator.

(17) The manufacturing method of any one of (14) to (16), wherein the spot heating treatment step includes heating the piezoelectric material to a Curie temperature of the piezoelectric material or higher.

(18) The manufacturing method of anyone of (14) to (17), wherein the spot heating treatment step includes locally applying a laser beam to the piezoelectric material of the at least one piezoelectric vibrator.

(19) The manufacturing method of any one of (14) to (17), wherein the spot heating treatment step includes locally applying an infrared ray to the piezoelectric material of the at least one piezoelectric vibrator.

(20) The manufacturing method of any one of (14) to (17), wherein the spot heating treatment step includes locally abutting a heating terminal against the piezoelectric material of the at least one piezoelectric vibrator.

(21) The manufacturing method of (1), further comprising:
    a semi-saturation polarization treatment step, executed prior to the displacement amount measurement step, of polarizing the piezoelectric material to put the piezoelectric material into a semi-saturation polarization state, not into a saturation polarization state, and wherein
    the displacement amount adjustment step includes a polarization adjustment step of adjusting the polarization state of the piezoelectric material of the at least one piezoelectric vibrator by selecting at least one of a re-polarization treatment of re-polarizing the piezoelectric material in a direction from the semi-saturation polarization state toward the saturation polarization state and a spot heating treatment of locally heating the piezoelectric material to partially depolarizing the piezoelectric material.

(22) The manufacturing method of (1), wherein the displacement amount adjustment includes a heating polarization adjustment step of supplying a polarization drive signal to the electrodes to charging and discharging the piezoelectric material alternately and to generate heat from the at least one piezoelectric vibrator, and polarizing the piezoelectric material of the at least one piezoelectric vibrator under the heat thus generated.

(23) The manufacturing method of any one of (7) to (22), wherein the laminate structure includes common internal electrodes and segment internal electrodes laminated alternately with a layer of the piezoelectric material interposed between adjacent pair of the common and segment internal electrodes to form an active region in a free end part.

(24) The manufacturing method of (23), wherein each of the piezoelectric vibrators is displaced in a direction orthogonal to a lamination direction by the action of an electric field.

(25) The manufacturing method of (23), wherein each of the piezoelectric vibrators is displaced in a lamination direction by the action of an electric field.

(26) The manufacturing method of any one of (23) to (25), further comprising:
    laminating piezoelectric material layers and internal electrode layers alternately to provide a laminate substrate;
    forming an external electrode layer on at least a surface of the laminate substrate to provide a laminate member; and
    at least partially cutting the laminate member to provide the piezoelectric vibrators in the form of teeth of comb.

(27) A manufacturing method of manufacturing a liquid jet head comprising a plurality of piezoelectric vibrators, each having, at least in part, a laminate structure of electrodes and at least one layer of piezoelectric material, and a plurality of liquid flow passages respectively formed for communication from a reservoir through pressure chambers to nozzle openings associated with the piezoelectric vibrators, wherein deformation of a piezoelectric vibrator causes deformation of a respective pressure chamber and changes liquid pressure in the respective pressure chamber to thereby eject liquid from a respective nozzle opening, the manufacturing method comprising:
    an ejection characteristic measurement step of applying the same drive signal to all the piezoelectric vibrators to eject liquid from the nozzle openings, and measuring liquid ejection characteristic in one-by-one basis of the nozzle openings; and
    an ejection characteristic adjustment step of setting a treatment condition for at least one of the piezoelectric vibrators based on a result of measurement by the ejection characteristic measurement step, and subjecting the at least one piezoelectric vibrator to a displacement amount adjustment based on the thus set treatment condition, thereby making the liquid ejection characteristic associated with the nozzle openings uniform.

(28) The manufacturing method of (27), wherein the liquid ejection characteristic includes a liquid ejection amount.

(29) The manufacturing method of (27), wherein the liquid ejection characteristic includes a liquid ejection speed.

(30) The manufacturing method of (27), wherein the liquid ejection characteristic includes an area of ejected liquid on an object.

(31) A piezoelectric vibrator unit comprising a plurality of piezoelectric vibrators, each having at least in part, a laminate structure including first and second internal electrodes laminated alternately with a layer of piezoelectric material interposed between adjacent pairs of the first and second internal electrodes to an active region in a free end part, a first external electrode electrically conducted to the first internal electrodes and a second external electrode electrically conducted to the second internal electrodes, wherein a potential difference is given to the piezoelectric material in the active region through the first and second external electrodes to activate the piezoelectric material, thereby displacing the free end part in a direction orthogonal to a lamination direction, wherein:
    at least one of the first and second external electrodes is formed on a free end part surface of an outermost layer of the piezoelectric material in the lamination direction so that a part of the piezoelectric material outermost layer, located in the active region, can be activated;
    the part of the piezoelectric material outermost layer, located in the active region, is used as a trimming portion whose effective range can be varied by trimming;
    an active range of the piezoelectric material outermost layer can be varied by trimming the trimming portion to adjust the displacement amount of the piezoelectric vibrator.

(32) The piezoelectric vibrator unit of (31), wherein the piezoelectric vibrators are manufactured by
    laminating piezoelectric material layers and internal electrode layers alternately to provide a laminate substrate;

forming an external electrode layer on at least a surface of the laminate substrate to provide a laminate member; and at least partially cutting the laminate member to provide the piezoelectric vibrators in the form of teeth of comb.

(33) The piezoelectric vibrator unit of (31) or (32), wherein:

the first internal electrodes are common internal electrodes set to the same potential level for all the piezoelectric vibrators;

the second internal electrodes are segment internal electrodes whose potential level is set depending on the respective piezoelectric vibrator;

the first external electrodes are common external electrodes set to the same potential level for all the piezoelectric vibrators; and the second external electrodes are segment external electrodes whose potential level is set depending on the respective piezoelectric vibrator.

(34) The piezoelectric vibrator unit of anyone of (31) to (33), wherein each of the piezoelectric vibrators includes an inactive part which is not displaced even when the piezoelectric material in the active region is activated, and the inactive part is joined to a fixing plate.

(35) The piezoelectric vibrator unit of any one of (31) to (34), wherein each of the piezoelectric vibrators includes an inactive part which is not displaced even when the piezoelectric material in the active region is activated, and the first and second external electrodes are brought into electrically conducted to a wiring member in the inactive part.

(36) The piezoelectric vibrator unit of anyone of (31) to (35), wherein the piezoelectric material outermost layer is thicker than an internal layer of piezoelectric material.

(37) A liquid jet head comprising:

a piezoelectric vibrator unit manufactured according to the manufacturing method of any one of (1) to (26); and a flow passage unit having a plurality of liquid flow passages that are respectively associated with the piezoelectric vibrators, and that respectively extend from a reservoir through pressure chambers to nozzle openings, wherein:

the piezoelectric vibrator unit is attached to the flow passage unit so that the piezoelectric vibrators are respectively contacted with diaphragm parts of the pressure chambers associated with the piezoelectric vibrators; and deformation of the piezoelectric vibrator deforms the associated pressure chamber and changes liquid pressure to in the associated pressure chamber to thereby eject liquid from the associated nozzle opening.

(38) A liquid jet head manufactured according to the manufacturing method of any one of (27) to (30), the liquid jet head comprising:

a case defining a storage space in which the piezoelectric vibrators can be stored;

an adjustment opening formed through the case for communication between an outside of the case and the storage space to enable access to the piezoelectric vibrators stored in the storage space, wherein displacement amount adjustment can be conducted to each of the piezoelectric vibrator from the outside of the case through the adjustment opening.

(39) The liquid jet head of (38), wherein each of the piezoelectric vibrator includes common internal electrodes and segment internal electrodes laminated alternately with a layer of the piezoelectric material interposed between adjacent pair of the common and segment internal electrodes to form an active region in a free end part.

(40) The liquid jet head of (39), wherein each of the piezoelectric vibrators is displaced in a direction orthogonal to a lamination direction by the action of an electric field.

(41) The liquid jet head of (39), wherein each of the piezoelectric vibrators is displaced in a lamination direction by the action of an electric field.

(42) The liquid jet head of any one of (39) to (41), wherein the piezoelectric vibrators are manufactured by:

laminating piezoelectric material layers and internal electrode layers alternately to provide a laminate substrate;

forming an external electrode layer on at least a surface of the laminate substrate to provide a laminate member; and at least partially cutting the laminate member to provide the piezoelectric vibrators in the form of teeth of comb.

The present disclosure relates to the subject matter contained in Japanese patent application Nos. Hei. 11-371155 (filed on Dec. 27, 1999), 2000-17886 (filed on Jan. 24, 2000), and, which are expressly incorporated herein by reference in their entireties.

DESCRIPTION OF THE PREFERRED EMBODIMENT

Referring now to the accompanying drawings, preferred embodiments of the invention will be described. In the following description, an ink jet recording head is discussed as an example of a liquid jet head. The recording head is not only used in an image recording apparatus such as a printer and a plotter, but also applicable to industrial machines.

Figure 1:
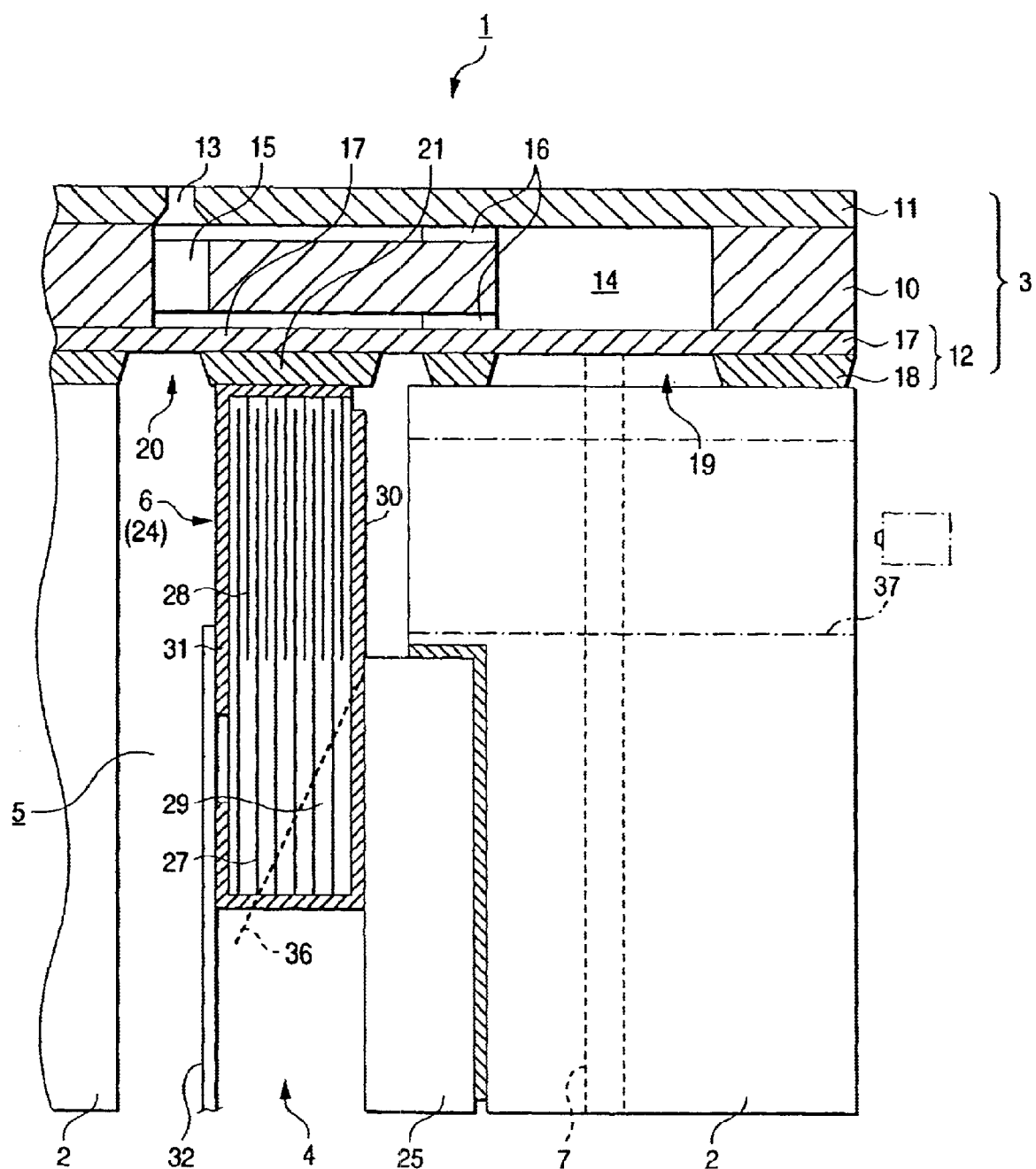
FIG. 1 is a sectional view to show the main part of an ink jet recorder on an enlarged scale.

A recording head 1 shown in FIG. 1 includes a case 2, a flow passage unit 3, a piezoelectric vibrator unit 4, etc. For convenience in describing the recording head 1, the top of FIG. 1 is referred to as a leading end side and the bottom of FIG. 1 is referred to as a base end side.

The case 2 is a block-shaped member made of a synthetic resin, having a storage space 5, the leading end and the rear end of which are both open. The flow passage unit 3 is joined to the leading end of the case 2, and the piezoelectric vibrator unit 4 is housed in the storage space 5 in a state in which the leading ends of comb-shaped teeth of a vibrator group 6 is confronted with the leading end side opening of the storage space 5. An ink supply tube 7, which communicates with an ink cartridge (not shown) on the base end side, is provided to a lateral side of the storage space 5.

The flow passage unit 3 is mainly made up of a flow passage formation plate 10, a nozzle plate 11, and an elastic plate 12.

The nozzle plate 11 is a thin plate-like member provided with a plurality of (for example, 96) nozzle openings 13 . . . arrayed in a row or rows at pitches corresponding to dot formation density. The nozzle plate 11 is formed, for example, by a stainless plate.

The flow passage formation plate 10 stacked or laminated on the nozzle plate 11 is formed with a reservoir 14 (a common ink chamber) into which ink supplied through the ink supply tube 7 flows, pressure chambers 15 each for generating ink pressure required for ejecting ink from a corresponding one of the nozzle openings 13, and ink supply ports 16 for communication of the reservoir 14 with the pressure chambers 15. In the embodiment, a silicon wafer is subjected to etching treatment to obtain the flow passage formation plate 10 having these components.

In the embodiment, the elastic plate 12 has such a double structure that a polymer film, such as PPS (polyphenylene sulfide), is laminated as an elastic film 17 on a support plate 18, such as a stainless plate. The support plate 18 are partially perforated by etching treatment so that a compliance part 19 corresponding to the reservoir 14 and diaphragm parts 20 corresponding to the respective pressure chambers 15 are formed only by the elastic film 17. Each diaphragm part 20 is formed with an island part 21 by removing the support plate 18 annularly so as to leave the center portion. The island part 21 has a rear side to which the leading end surface part of a respective drive vibrator 24 described later is joined. A plurality of the island parts 21 are provided at pitches corresponding to the dot formation density similarly to the nozzle openings 13, and each of the island parts 21 is formed as a block having a narrow width corresponding to the nozzle array direction and a longer length corresponding to the laminated direction (described later) in the drive vibrator 24.

The flow passage unit 3 is manufactured by placing the nozzle plate 11 and elastic plate 10 on the front side and the rear side of the flow passage formation plate 10, respectively to interpose the flow passage formation plate 10 between the nozzle plate 11 and the elastic plate 12, and integrating them together by bonding, etc. The elastic plate 12 of the flow passage unit 3 forms a part of a seal member for sealing the ceiling surfaces of the pressure chambers 15 and the reservoir 14. Therefore, a set of ink flow passages are defined within the flow passage unit 3, which correspond in number to the drive vibrators 24 and which respectively extend from the reservoir 15 through the pressure chambers 15 to the nozzle openings 13. The ink flow passage corresponds to a liquid flow passage of the invention.

Figure 2:
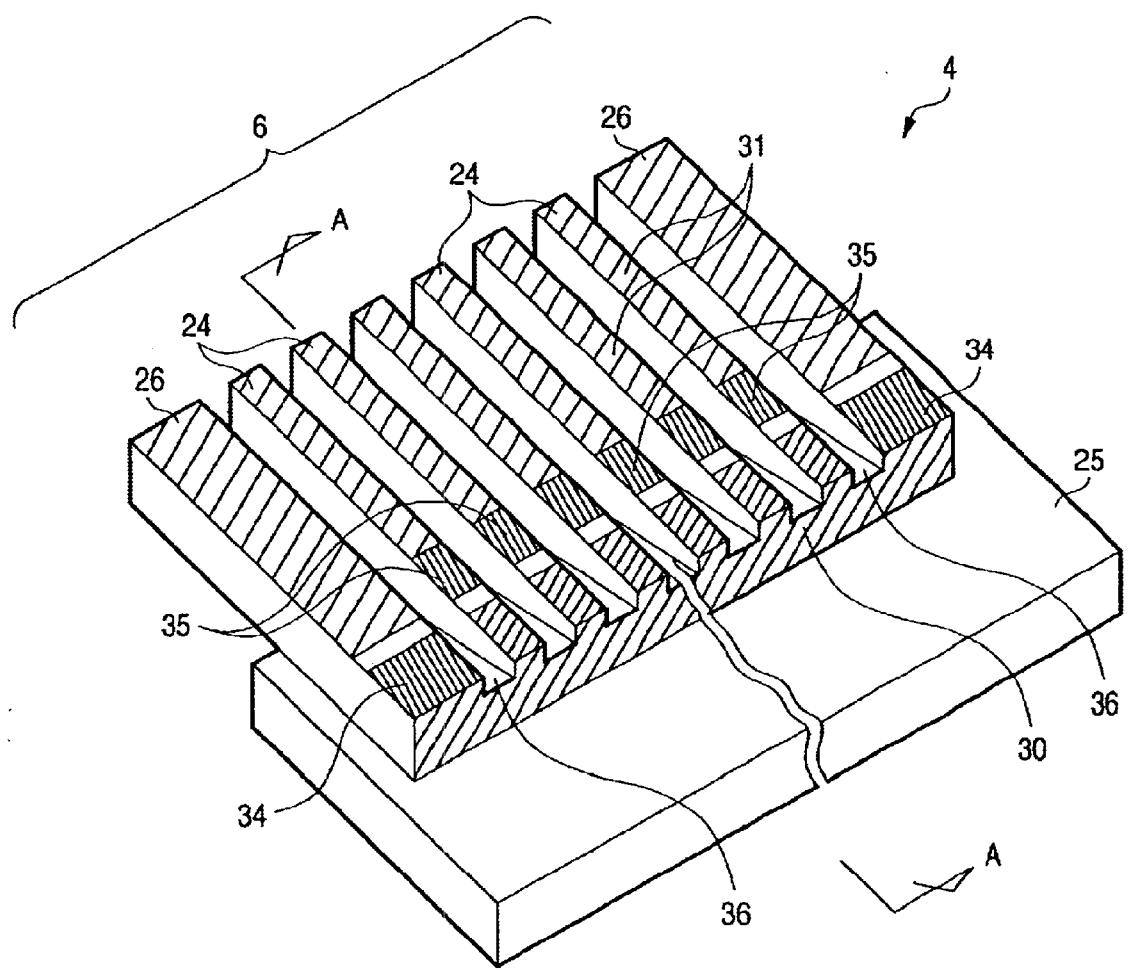
FIG. 2 is a perspective view of the appearance of a piezoelectric vibrator unit.

As shown in FIG. 2, the piezoelectric vibrator unit 4 is mainly made up of the vibrator group 6 having a plurality of piezoelectric vibrators 24 and 26, and a fixing plate 25 for supporting the vibrator group 6. The piezoelectric vibrators are arrayed as a row like teeth of the comb shape, and the vibrator group 6 has a pair of dummy vibrators 26 and 26 located at both outermost ends in the row (in the array direction), and a plurality of drive vibrators 24 . . . disposed between the dummy vibrators 26 and 26. The drive vibrators 24 are piezoelectric vibrators associated with ink droplet ejection, and formed separately one from another into needles each having an extremely narrow width of about 50 $\mu$m to 100 $\mu$m, for example. The dummy vibrators 26 are piezoelectric vibrator not associated with the ink droplet ejection, each having a sufficiently wider width than the drive vibrator 24 so as to provide necessary rigidity. The drive vibrator 24 in the embodiment is a piezoelectric vibrator of so-called vertical vibration mode, and displaced (expanded and contracted) in a direction orthogonal to the laminating direction of the piezoelectric members and the electrodes, as descried later.

Figure 3:
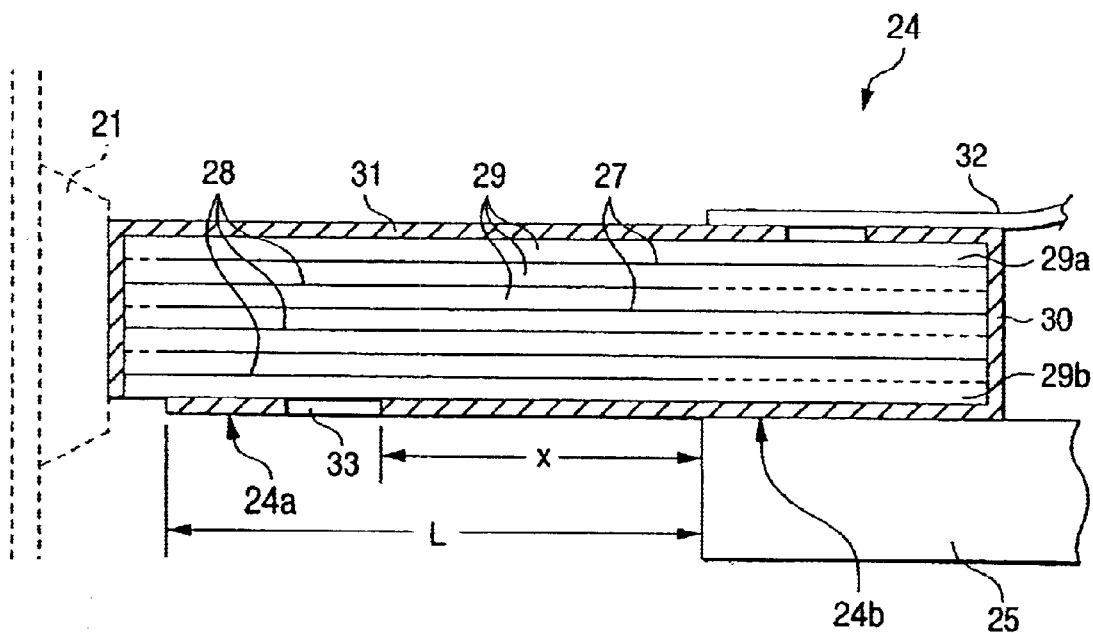
FIG. 3 is a sectional view take on line A—A in FIG. 2.

Next, the drive vibrator 24 will be discussed. As shown in FIG. 3, the drive vibrator 24 is a laminated-type piezoelectric vibrator in which common internal electrodes 27 (corresponding to first internal electrodes of the invention) and segment internal electrodes 28 (corresponding to second internal electrodes of the invention) are laminated alternately with piezoelectric material (a layer of piezoelectric material) 29 interposed between the adjacent internal electrodes. The common internal electrodes 27 are electrodes for setting the same potential level for all drive vibrators 24. The segment internal electrodes 28 are electrodes, each for setting a potential level for a respective drive vibrator 24 in response to a supplied drive signal.

In the embodiment, the portion of the drive vibrator 24 from the leading end thereof to about a half or two thirds in the vibrator length direction (direction orthogonal to the lamination direction) is a free end part 24a. The remaining portion of the drive vibrator 24, namely, the portion from the end of the free end part 24a to the vibrator base end is a base end part 24b.

The free end part 24a is formed with an active region L where the common internal electrodes 27 and the segment internal electrodes 28 overlap each other (overlap portion). When a potential difference is given to the internal electrodes 27, 28, the piezoelectric material 29 in the active region L is activated and deformed so that the free end part 24a is displaced (expanded or contracted) in the vibrator length direction. The base ends of the common internal electrodes 27 are electrically conducted to a common external electrode 30 at the base end surface part of the drive vibrator 24. On the other hand, the leading ends of the segment internal electrodes 28 are electrically conducted to a segment external electrode 31 at the leading end surface part of the drive vibrator 24. The leading ends of the common internal electrodes 27 are positioned slightly behind the leading end surface part of the drive vibrator 24 so as not to be exposed from the leading end surface part of the drive vibrator 24. The base ends of the segment internal electrodes 28 are positioned at the boundary between the free end part 24a and the base end part 24b.

The segment external electrode 31 is an electrode formed on the leading end surface part of the piezoelectric vibrator 24 and a wiring connection surface (upper surface in FIG. 3) of the piezoelectric vibrator 24, i.e. one side surface in the lamination direction in the piezoelectric vibrator 24, for electrical connection of the segment internal electrodes 28 to a wiring pattern of a flexible cable 32 (a kind of wiring member of the invention). The portion of the segment external electrode 31 on the wiring connection surface side is formed continuously from leading end surface part to reach the base end part 24b. As shown in FIG. 2, a plurality of segment external electrodes 31 are provided for respective drive vibrators 24.

The common external electrode 30 is an electrode formed on the base end surface part of the piezoelectric vibrator 24, the wiring connection surface, and a fixing plate attachment surface (lower surface in FIG. 3), i.e. the opposite side surface in the lamination direction in the piezoelectric vibrator 24, for electrical connection of the common internal electrodes 27 to the wiring pattern of the flexible cable 32. The portion of the common external electrode 30 on the wiring connection surface is formed continuously from a position slightly behind the end part of the segment external electrode 31 toward the base end surface part and the portion of the common external electrode 30 on the fixing plate attachment surface is formed continuously from a position slightly behind the leading end surface part of the vibrator toward the base end surface part. As shown in FIG. 2, the common external electrode 30 in this embodiment continuously extends across the vibrator group 6 in the array direction at least on the base end surface part of the vibrator group 6.

Each of the external electrodes 30 and 31 also functions as an electrodes for activating the piezoelectric material 29 of the outermost layer (corresponding to an outermost piezoelectric material of the invention). That is, the segment external electrode 31 is paired with the common internal electrode 27 such that piezoelectric material 29a formed as the outermost surface in the lamination direction is interposed therebetween, and the common internal electrode 27 and the segment external electrode 31 overlap each other in the active region L. Therefore, the portion of the piezoelectric material 29a in the active region L becomes deformed due to the potential difference between the common internal electrode 27 and the segment external electrode 31. Likewise, the common external electrode 30 is paired with the segment internal electrode 28 such that piezoelectric material 29b formed on the outermost surface in the lamination direction is interposed therebetween, and the segment internal electrode 28 and the common external electrode 30 overlap each other in the active region L. Therefore, the portion of the piezoelectric material 29b in the active region L becomes deformed due to the potential difference between the segment internal electrode 28 and the common external electrode 30. In short, in the piezoelectric material 29a, 29b, the regions having both surfaces directly sandwiched between the electrodes 27, 28, 30, 31 become deformed.

In the embodiment, the portion of the common external electrode 30 in the active region L is used as a trimming portion. An effective length x (range in which the piezoelectric material 29b is activated) of this trimming portion is varied by trimming, namely, removing a part of the common external electrode 30. For example, if the trimming portion is not subjected to trimming, the common external electrode 30 having the effective length x equal to the active region L activates the piezoelectric material 29b.

If the part of the common external electrode 30 is removed from a removal region 33 shown in FIG. 3, the common external electrode 30 having the effective length x shorter than the active region L activates the piezoelectric material 29b. This means that the leading end side portion of the piezoelectric material 29b ahead of the effective length x becomes inactive, and is not associated with expansion or contraction of the drive vibrator 24. Therefore, the active range in the piezoelectric material 29b becomes narrow to make the displacement amount of the drive vibrator 24 smaller than that in the state in which trimming is not executed.

Figure 4:
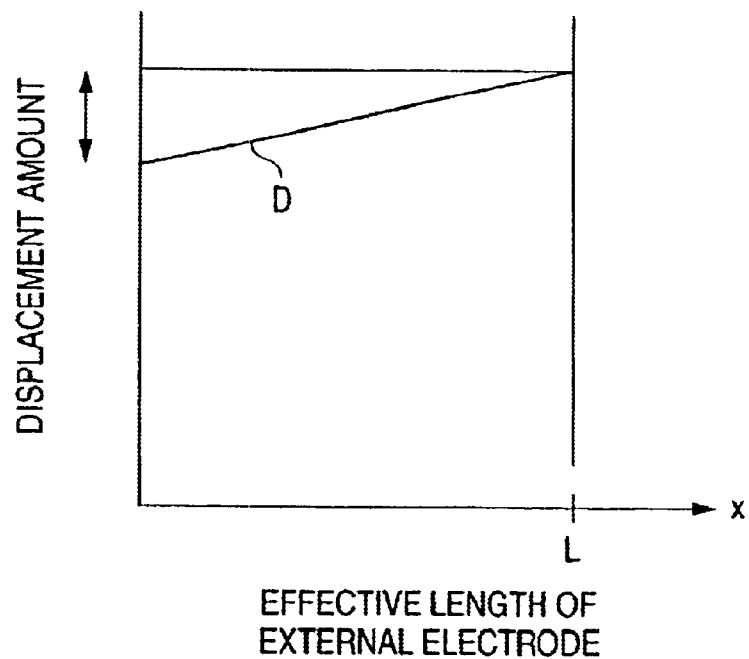
FIG. 4 is a drawing to show the relationship between the effective length of an external electrode and displacement amount.

The displacement amount of the drive vibrator 24 is decreased almost linearly as indicated by the line of letter D in FIG. 4 as the effective length x of the external electrode becomes shorter. Thus, it is seen that the displacement amount of the drive vibrator 24 can be changed as it is lessened depending on how the effective length x is given. The number of laminated layers of the piezoelectric material 29 normally is about 20 to 30 although several layers are shown in the figure for simplifying the illustration. Thus, the displacement amount can be changed at about several % of the entire displacement amount by adjusting the effective length x of the trimming portion. A specific trimming procedure will be described later.

The base end part 24b functions as an inactive part not expanded or contracted even when the piezoelectric material 29 in the active region L is activated. The flexible cable 32 is disposed on the wiring connection surface side of the base end part 24b, and the segment external electrode 31 and the common external electrode 30 are electrically connected to the flexible cable 32 on the base end part 24b. That is, each common electrode wiring part 34 and each segment electrode wiring part 35 shown in FIG. 2 function as wiring connection parts 34 and 35 onto which connection end parts of the flexible cable 32 are placed onto the wiring connection parts 34 and 35. The flexible cable 32 is installed in place by soldering, etc. A drive signal is supplied through the flexible cable 32 to each electrode. The fixing plate attachment surface of the base end part 24b functions as a fixing plate joint part onto which the fixing plate 25 is joined. In short, the drive vibrators 24 . . . and the dummy vibrators 26 and 26 are joined onto the fixing plate 25 in a so-called cantilever state.

Next, a manufacturing method of the piezoelectric vibrator unit 4 will be discussed. In this manufacturing method, first a plate-like laminate member is manufactured (laminate member manufacturing step).

In this step, in the beginning, a plate-like laminate substrate is manufactured by laminating the common internal electrodes 27 and the segment internal electrodes 28 alternately with the piezoelectric material 29 interposed therebetween so that the common internal electrodes 27 and the segment internal electrodes 28 overlap in the leading end side portion forming the free end part 24a and that a non-overlapping region where only the common internal electrodes 27 exist is formed in the base end side portion forming the base end part 24b (laminating step).

If the laminate substrate is manufactured, a segment external electrode 31 is formed continuously on the leading end surface part of the laminate substrate and the range of the wiring connection surface from the leading end thereof to the top of the base end part 24b, and a common external electrode 30 is formed continuously on the base end surface part of the laminate substrate, the range of the wiring connection surface from the base end thereof to the top of the base end part 24b, and the fixing plate attachment surface, thereby manufacturing a laminate member with the external electrodes (external electrode formation step).

The laminate member thus manufactured is cut to provide a vibrator group 6 having a plurality of piezoelectric vibrators 24 and 26 arrayed in a row (vibrator manufacturing step). In this step, first a fixing plate 25 is joined to the fixing plate attachment surface of the base end part 24b of the laminate member by bonding, etc. After the fixing plate 25 is joined, a wire saw, a dicing saw, etc., is used to cut and divide the laminate member into teeth of the comb, i.e. into individual piezoelectric vibrators 24 and 26 in the form of elongated needles, as shown in FIG. 2. At this time, as shown in FIGS. 1 and 2, a slant groove 36 is formed so that cutting lines for the laminate member on the fixing plate 25 side extends down to the leading end position of the fixing plate 25 and the cutting lines on the wiring connection surface side extends down to the base end surface part. The reason why the plate-like laminate member is joined to the fixing plate 25 before it is divided into teeth of comb is to stably divide the laminate member and facilitate handling during subsequent processing. Therefore, if the laminate member can be stably divided into teeth of comb, the laminate member may be joined to the fixing plate 25 after it is divided into teeth of comb.

In the piezoelectric vibrator unit 4 thus manufactured, each drive vibrator 24 has an extremely narrow width of about 50 $\mu$m to 100 $\mu$m. Thus, if a defect or a pinhole larger than the width only exists in an internal electrode, the portion using the internal electrode 27 or 28 loses activity and is not displaced. When the internal electrodes 27 and 28 are laminated sequentially, an offset of an internal electrode may occur. Further, since the mechanical processing method is adopted, the widths of the drive vibrators 24 may be varied. For these reasons, there is a possibility that the displacement amount (expansion or contraction amount) of each of the drive vibrators 24 formed like comb teeth may vary from one drive vibrator 24 to another.

Then, in the embodiment, after the plate-like laminate member is divided like comb teeth to provide the piezoelectric vibrators 24 and 26, the displacement amounts of the drive vibrators 24 . . . are adjusted to be uniform. In the embodiment, a laser beam is irradiated onto the trimming portion of the drive vibrator 24 (portion of the common external electrode 30 in the active region L) to partially remove the common external electrode 30. With this processing, the displacement amounts of the drive vibrators 24 . . . are made identical to the displacement amount of the drive vibrator 24 having the smallest displacement amount. This means that the drive vibrator 24 having the smallest displacement amount is used as a reference vibrator, and the displacement amounts of other drive vibrators 24 . . . are adjusted to be identical to the displacement amount of the reference vibrator. This makes the displacement amounts of the drive vibrators 24 . . . uniform.

A displacement amount adjustment method will be discussed with reference to a flowchart of FIG. 5.

As a first step of the adjustment method, the displacement amounts of all drive vibrators 24 . . . with respect to reference voltage are measured separately (displacement amount measurement step, S1). In the displacement amount measurement step, for example, the displacement speed of each drive vibrator 24 when the reference voltage is supplied between the common electrode (the common external electrode 30, the common internal electrodes 27) and the segment electrode (the segment external electrode 31, the segment internal electrodes 28) is measured using a laser Doppler vibration meter, etc., and is integrated in the time direction, thereby calculating the displacement amount. The displacement amount may be measured directly using a laser displacement gage, etc.

The drive vibrator 24 having the smallest displacement amount with respect to the reference voltage among all drive vibrators 24 . . . is used as the reference vibrator, and the displacement amount of the reference vibrator is set to a target displacement amount (target value).

If the target displacement amount is set, the treatment conditions for the respective drive vibrators 24 . . . are set based on the measurement result of the displacement amount measurement step, and displacement amount adjustment is executed based on the setup treatment conditions (displacement amount adjustment step).

In the displacement amount adjustment step, first, the treatment conditions are set. In the embodiment, the displacement amount of each drive vibrator 24 is adjusted by trimming the trimming portion and thus the trimming amount is set as the treatment condition for each drive vibrator 24. That is, the measured displacement amount of each drive vibrator 24 is obtained, and the difference between the obtained displacement amount and the target displacement amount is calculated (S2). Next, the effective length x of the trimming portion is calculated from the difference between the displacement amount measurement value and the target displacement amount. This means that what $\mu$m the common external electrode 30 is to be trimmed is calculated (S3).

To execute this calculation, for example, table information indicating the relationship between the effective length x of the common external electrode 30 and the displacement amount as shown in the graph of FIG. 4 is previously stored in memory of a microcomputer forming a controller, and is referenced.

If the treatment condition is set, trimming treatment (a kind of displacement amount adjustment) is performed based on the setup treatment condition. That is, laser beam machining is performed based on the calculated trimming amount and the trimming portion is trimmed to remove a part of the common external electrode 30 (S4).

If the trimming treatment at step S4 is performed, whether or not an unadjusted drive vibrator 24 exists is determined (S5) If an unadjusted drive vibrator 24 exists, control returns to step S2 and the treatment for the unadjusted drive vibrator 24 is executed in a similar manner. On the other hand, if the treatment for all drive vibrators 24 . . . terminates, adjustment to the piezoelectric vibrator unit 4 is terminated.

The piezoelectric vibrator unit 4 manufactured according to the described procedure is disposed so that the leading end surface parts of the drive vibrators 24 are contacted with and joined to the rear sides of the island parts 21 of the diaphragm parts 20, respectively, as shown in FIG. 1. Thus, when a drive signal is supplied to expand or contact the drive vibrator 24 in the vibrator length direction, the diaphragm part 20 becomes deformed in the back and forth direction to change the volume of the pressure chamber 15.

To eject an ink droplet from the nozzle opening 13, a drive signal is supplied selectively to the drive vibrator 24 associated with the ink droplet ejection so that, for example, the pressure chamber 15 is once expanded, then contracted. In doing so, as the pressure chamber 15 is expanded, ink in the reservoir 14 flows into the pressure chamber 15, and as the pressure chamber 15 is contracted, the ink pressure in the pressure chamber 15 is raised. Ink pushed out from the nozzle opening 13 is ejected as an ink droplet.

At this time, in the embodiment, the piezoelectric vibrator unit 4 is manufactured through the displacement amount measurement step and the displacement amount adjustment step, and the displacement amounts of the drive vibrators 24 are made identical with the displacement amount of the reference vibrator, so that the ejection characteristic, such as the ink droplet ejection amount, the ejection speed, the dot size (area of the ejected ink droplet) onto a print recording medium, such as record paper, etc., (namely, the liquid ejection characteristic) can be made uniform at high level.

Even the piezoelectric vibrator unit 4 which had to be handled as a defective formerly can be mounted to a product by being subjected to this adjustment, and the manufacturing yield can also be raised.

To set the target displacement amount, the drive vibrator 24 having the smallest displacement amount with respect to the reference voltage is used as the reference vibrator, and the displacement amounts of other drive vibrators 24 . . . are adjusted to be identical to the displacement amount of the reference vibrator in the displacement amount adjustment step, but the invention is not limited to this method. For example, a displacement amount smaller than the displacement amount of the reference vibrator is set as the target displacement amount, and the displacement amounts of all drive vibrator 24 including the reference vibrator may be adjusted to be identical to the target displacement amount thus set.

If the displacement amounts of drive vibrators 24 . . . other than the reference vibrator are adjusted to be identical to the displacement amount of the reference vibrator as in the above-described method, the displacement amount adjustment can be minimized, and thus conducted efficiently.

In the embodiment, the effective length x of the common external electrode 30 is adjusted at the last stage of the manufacturing step of the piezoelectric vibrator unit 4. Accordingly, the possibility that the displacement amount of each drive vibrator 24 may be changed after the adjustment is low, and adjustment can be made reliably.

To adjust the effective length x, any method may be adopted if a part of the common external electrode 30 can be removed. If laser beam machining is adopted as in the embedment, a part of the common external electrode 30 can be removed easily with good accuracy.

By the displacement amount adjustment of the embodiment, only one external electrode (common external electrode 30) is made partially inactive and thus there is a possibility that a bending mode (deflection mode) may occur when the drive vibrator 24 is displaced. However, since the leading end surface part of the drive vibrator 24 is joined to the island part 21, and the bending mode is restricted and does not appear because of bonding to the island part 21. Consequently, only a vibration mode for expanding and contracting in the vibrator length direction occurs.

By the way, the above-described adjustment method is a method of executing one trimming treatment for one drive vibrator 24 for adjustment, but the invention is not limited to this adjustment method. For example, plural trimming treatment may be executed for one drive vibrator 24 for adjustment.

Next, this adjustment method will be discussed with reference to a flowchart of FIG. 6. The adjustment method includes a displacement amount measurement step and a displacement amount adjustment step similarly to the adjustment method previously described with reference to FIG. 5.

Figure 5:
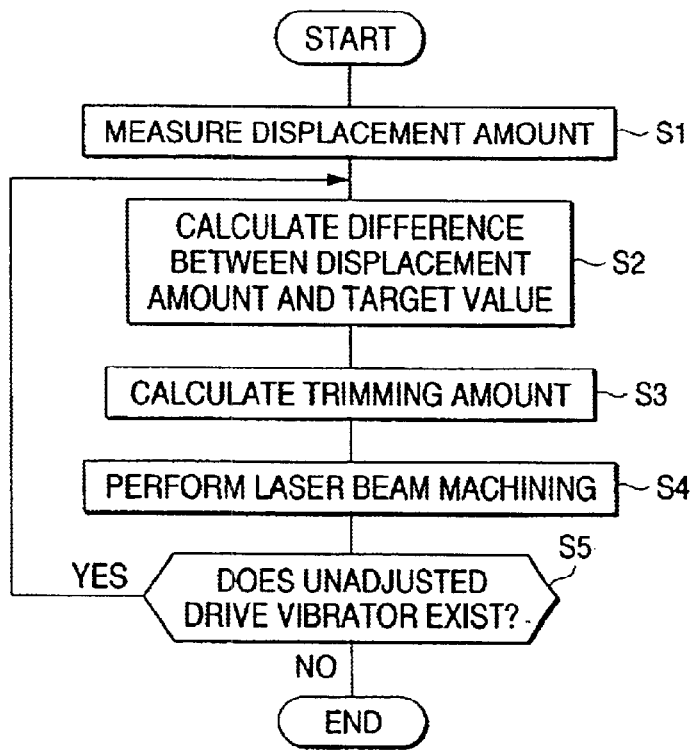
FIG. 5 is a flowchart to describe a displacement amount adjustment method by executing trimming.
Figure 6:
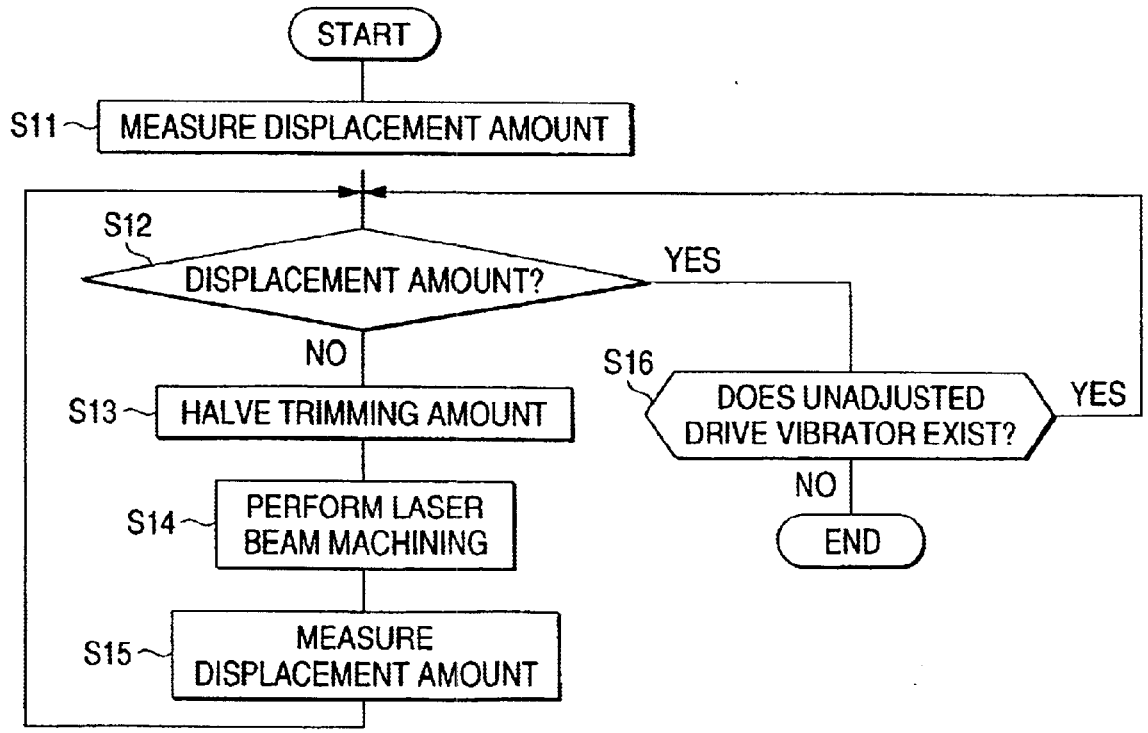
FIG. 6 is a flowchart to describe another displacement amount adjustment method by executing trimming.

That is, in the displacement amount measurement step, the displacement amount of each of the drive vibrators 24 . . . is measured as at step SI in FIG. 5 and the target displacement amount is set (S11). If the target displacement amount is set, the displacement amount of the drive vibrator 24 to be adjusted is obtained and whether or not the obtained displacement amount falls within a predetermined allowable range is determined (S12).

If the obtained displacement amount is out of the allowable range, a program advances to the displacement amount adjustment step. In this displacement amount adjustment step, first the treatment condition is set. In this method, first a difference between the displacement amount of the drive vibrator 24 to be adjusted and the target displacement amount is calculated and the trimming amount is determined based on the difference. If the trimming amount is determined, the half value of the determined trimming amount is set as an actual trimming amount adopted for actually removing a part of the common external electrode 30 (S13). If the treatment condition (actual trimming amount) is thus set, laser beam machining is performed based on the setup treatment condition for removing a part of the common external electrode 30 (S14).

If trimming is performed, the displacement amount of the drive vibrator 24 to be adjusted is measured (S15) and step S12 is subsequently executed. At step S12, the displacement amount measured at step S15 is compared with the target displacement amount and similar treatment to the above-described treatment is executed.

At step S12, if the displacement amount of the drive vibrator 24 to be adjusted falls within the predetermined allowable range, the adjustment for the drive vibrator 24 is terminated and whether or not an unadjusted drive vibrator 24 exists is determined (S16). If an unadjusted drive vibrator 24 exists, the program returns to step S12 and the treatment for the unadjusted drive vibrator 24 is executed in a similar manner. On the other hand, if the treatment for all drive vibrators 24 . . . terminates, adjustment to the piezoelectric vibrator unit 4 is terminated.

If the adjustment method as described above is adopted, trimming is executed gradually over several times, so that the trimming portion is removed little by little. Thus, overtrimming can be prevented reliably.

To make the above-described trimming adjustment method more effective, it is preferable that the piezoelectric material 29a, 29b of the outermost layer is made thicker than other piezoelectric material 29. The piezoelectric material 29a, 29b of the outermost layer, which is thicker than other piezoelectric material 29, can protect internal electrodes 27 and 28 if the trimming unintentionally reaches the piezoelectric material 29a, 29b of the outermost layer. This makes it possible to obtain the piezoelectric vibrator unit 4 which can be reliably mounted to a product. Therefore, the manufacturing yield of the piezoelectric vibrator unit 4 can be raised.

Figure 7:
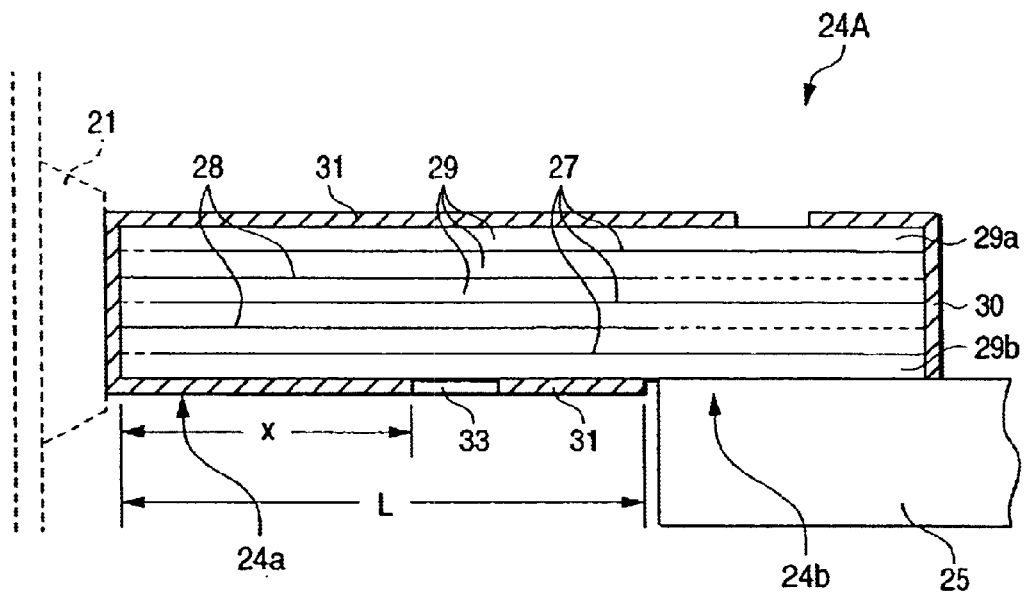
FIG. 7 is a sectional view to describe another drive vibrator configuration.

As shown in FIG. 7, the trimming portion can also be provided using the segment external electrode 31. A drive vibrator 24A of a modified example is manufactured, for example, according to the following procedure: Common internal electrodes 27 and segment internal electrodes 28 are laminated alternately with piezoelectric material 29 interposed between adjacent electrodes, thereby manufacturing a laminate substrate. The laminate substrate has a non-overlapping region where only the common internal electrodes 27 exist.

Note that the non-overlapping region may contain, in addition to the internal electrodes 27, dummy internal electrodes which are not electrically connected to the cable 32. This is also applied to the former embodiment.

In addition, the laminate substrate in the modified example has the common internal electrodes 27, 27 as the outermost internal electrodes as shown in FIG. 7.

If the laminate substrate is manufactured, a common external electrode 30 is formed continuously in the range from the rear end surface part of the laminate substrate to the base end part 24b on the wiring connection surface so as to be connected to the common internal electrodes 27 on the rear end surface part in a direction orthogonal to the lamination direction of the laminate substrate. A segment external electrode 31 is formed continuously from the fixing plate attachment surface of the laminate substrate through the leading end surface part to the wiring connection surface so as to be connected to the segment internal electrodes 28 on the leading end surface part of the laminate substrate. Consequently, a laminate member is manufactured. If the laminate member is manufactured, a fixing plate 25 is joined to the fixing plate attachment surface of the base end part 25b in the laminate member, and the laminate member is cut to have separate teeth of comb. The portion of the segment external electrode 31 on the fixing plate attachment surface is used as a trimming portion, and laser beam machining is executed for the trimming portion to partially remove the trimming portion of the segment external electrode 31. Accordingly, in the modified example, the displacement amounts of the drive vibrators 24A can also be adjusted to be uniform.

By the way, in the first embodiment, the trimming treatment is executed during the process of manufacturing the piezoelectric vibrator unit 4. The invention is not limited to this exemplified method. For example, the displacement amount adjustment (trimming treatment) may be executed after the vibrator unit, obtained by cutting the laminate member to have teeth of comb, is fixedly stored in the storage space 5 of the case 2. A second embodiment of the invention adopting this method will be discussed.

In the second embodiment, an adjustment opening 37 for communication between the outside of the case 2 and the storage space 5 is formed through the case 2, as indicated by one-dotted chain line in FIG. 1. The adjustment opening 37 is provided for executing the displacement amount adjustment for the drive vibrators 24 . . . from the outside of the case 2, and is confronted with the trimming portions of the drive vibrators 24 . . . .

Therefore, a laser beam is applied to each trimming portion through the adjustment opening 37, whereby the displacement amount of each drive vibrator 24 can be adjusted with the piezoelectric vibrator unit 4 built in the recording head 1.

A manufacturing method of recording head 1 according to the second embodiment will be discussed briefly.

In the manufacturing method, first a piezoelectric vibrator unit 4 is manufactured. A plate-like laminate member is manufactured as in the first embodiment. That is, the common internal electrodes 27 and the segment internal electrodes 28 are laminated alternately with the piezoelectric material 29 interposed between adjacent internal electrodes so that the active region is formed in the free end part 24a, thereby manufacturing a plate-like laminate substrate. A segment external electrode 31 and a common external electrode 30 are formed on the surface or surfaces of the laminate substrate, thereby manufacturing a laminate member provided with the external electrodes. If the laminate member is manufactured, a fixing plate 25 is joined to the fixing plate attachment surface of the laminate member, and the laminate member is cut to have teeth of comb teeth, i.e. a plurality of the piezoelectric vibrators 24 and 26.

If the piezoelectric vibrator unit 4 is manufactured, a case 2 and a flow passage unit 3 separately manufactured are joined to each other, and the piezoelectric vibrator unit 4 is accommodated in the interior of the joint assembly, i.e. within the storage space 5.

If the piezoelectric vibrator unit 4 is accommodated within the storage space 5, the liquid ejection characteristics of nozzle openings 13 . . . are adjusted. This adjustment method includes an ejection characteristic measurement step and an ejection characteristic adjustment step.

The ejection characteristic measurement step is a step at which the same drive signal is applied to all drive vibrators 24 . . . to eject the ink droplet from the nozzle openings 13 . . . , and the ink droplet ejection characteristic (a kind of liquid ejection characteristic) is measured for each of the nozzle openings 13 . . . . In the embodiment, the ink droplet ejection amount (namely, the liquid ejection amount) is measured as the ink ejection characteristic. For example, ink droplets are ejected repeatedly the stipulated number of times of about 10,000 to 100,000 from one nozzle opening 13 and the ink droplet ejection amount is calculated based on the difference between the weight before ink droplet ejection and that after ink droplet ejection. For example, the ejected ink droplets may be collected and their weight may be measured, or the ink droplet ejection amount may be obtained from the difference between the weight of the ink cartridge before and after the ink droplet ejection.

The ejection characteristic adjustment step is a step at which the liquid ejection characteristics of the nozzle openings 13 . . . are made uniform. In the embodiment, trimming treatment (a kind of displacement amount adjustment) is performed for the drive vibrators 24, thereby making the ejection characteristics uniform. That is, the treatment condition for each drive vibrator 24 is set based on the result of measurement by the ejection characteristic measurement step, and the trimming amount for the trimming portion is set based on the setup treatment condition. If the trimming amount is set, laser beam machining is executed for trimming the trimming portion to remove a part of the common external electrode 30. In this case, the drive vibrator 24 having the smallest ink droplet ejection amount is used as a reference vibrator, and the adjustment is conducted so that the displacement amounts of other drive vibrators 24 . . . are decreased, thereby making the ink droplet ejection amounts uniform.

If the adjustment method as described above is adopted, the displacement amount of each drive vibrator 24 is adjusted based on the ink amount actually ejected. Accordingly, the variation in ink ejection amount, which is caused by other factors than the drive vibrators 24, can be corrected by this adjustment. For example, the variation in ink ejection amount, caused by varying joint state of the drive vibrator 24 to the island part 21, varying size of the nozzle opening 13, varying shape of the pressure chamber 15, etc., can be all corrected by this adjustment. Since the displacement amount adjustment is carried out at the last stage of the manufacturing step of the recording head 1, any additional, wasteful steps, such as re-adjustment can be dispensed with. Accordingly, the manufacturing of the recording head 1 can be made efficient.

In the second embodiment, the liquid ejection characteristic is not limited to the ink droplet ejection amount. For example, it may be the ink droplet ejection speed (namely, liquid ejection speed) or maybe the size of a pixel (namely, the area of the ejected ink droplet) on a printing or recording medium obtained as an ink droplet is ejected onto the printing or recording medium. If any of them is selected as the liquid ejection characteristic, a similar advantage can be provided.

Although each of the above-described embodiments executes trimming of the trimming portions to adjust the displacement amounts of the drive vibrators 24 (24A), thereby making the ink droplet ejection amounts uniform, the invention is not limited thereto or thereby. For example, the polarization state of piezoelectric material 29 forming a part of the drive vibrator can also be adjusted for adjusting the displacement amount. A third embodiment of the invention wherein the polarization state is adjusted will be discussed.

Figure 8:
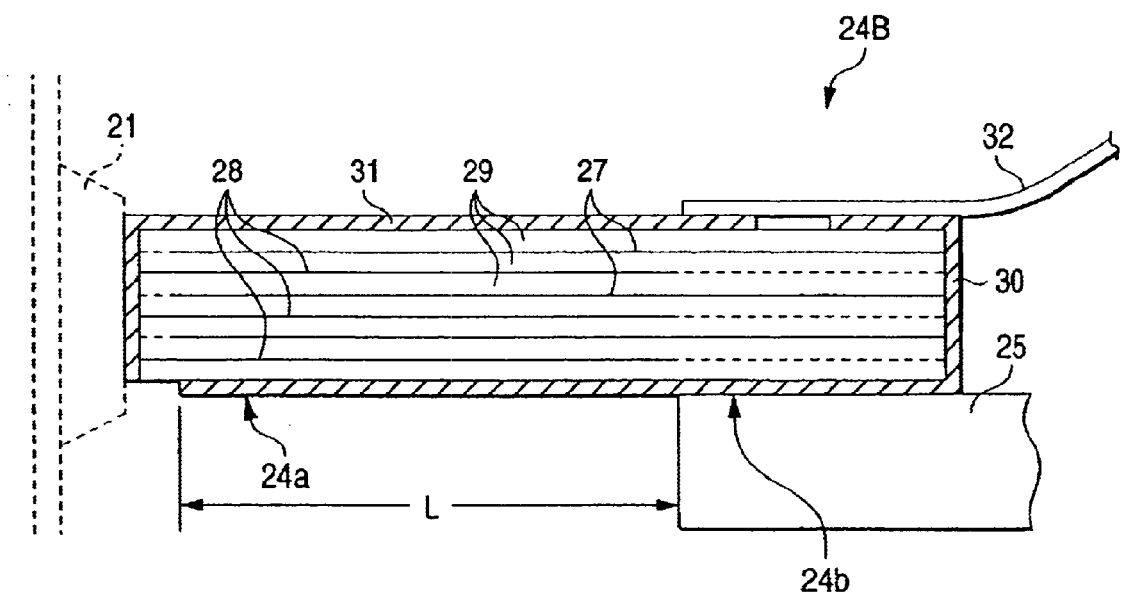
FIG. 8 is a sectional view to describe still another drive vibrator configuration.

The third embodiment slightly differs in piezoelectric vibrator configuration from the above-described embodiments. That is, as shown in FIG. 8, a drive vibrator 24B of the third embodiment has no trimming portion, and the surface, corresponding in location to the trimming portion, is covered with the external electrode. Other parts of the third embodiment are similar to those of the first and second embodiments, and therefore identical parts are denoted by the same reference numerals and will not be discussed again.

The embodiment is featured by a manufacturing method. This manufacturing method will be discussed in detail.

In this manufacturing method, first a plate-like laminate substrate is manufactured (laminating step). In this laminating step, an electrode layer 27, 28 is formed between adjacent layers of a large number of laminated piezoelectric material 29 . . . . Particularly, the common internal electrodes 27 and the segment internal electrodes 28 are laminated alternately with the piezoelectric material 29 interposed between adjacent internal electrodes, thereby manufacturing a laminate substrate. The common internal electrode 27 and the segment internal electrode 28 overlap to form an active region L located in the side forming a free end part 24a, and only the common internal electrodes 27 overlap to form an inactive region or non-overlapping region in the side forming a base end part 24b. That is, no active region is formed in the base end part 24b side.

Next, the laminate substrate is formed with external electrodes, thereby providing a laminate member (external electrode formation step). That is, the segment external electrode 31 is formed to present an inverted L shape extending from the leading end surface part, i.e. the free end part 24a side of the manufactured laminate substrate, to the lamination surface forming the wiring connection surface. The common external electrode 30 is formed to extend from the base end surface part of the laminate substrate to both surfaces of the lamination top and bottom surfaces. Consequently, a laminate member provided with the external electrodes is manufactured.

If the laminate member with the external electrodes is manufactured, the laminate member is cut to manufacture a vibrator group 6 having a plurality of piezoelectric vibrators 24B and 26 arrayed in a row (vibrator manufacturing step). In this step, a wire saw, a dicing saw, etc., is used to divide the free end part 24a side of the laminate member joined to the fixing plate 25 into needle-shaped segments each having an extremely narrow width of about 50 µm to 100 µm.

The piezoelectric vibrator unit 4 thus manufactured may have variation in displacement characteristic of the drive vibrators 24B as discussed with reference to the piezoelectric vibrator unit 4 of the first embodiment.

Accordingly, also in the third embodiment, the displacement amounts of the drive vibrators 24B . . . are made uniform after the plate-like laminate member is cut to have teeth of comb. In this method, re-polarization treatment is executed, by which the piezoelectric material 29 of semi-saturation polarization state is re-polarized in a forward direction so that the displacement amounts of the drive vibrators 24B . . . are made identical to the drive vibrator 24B having the largest displacement amount. That is, the drive vibrator 24B having the largest displacement amount is used as a reference vibrator, and the displacement amounts of other drive vibrators 24B . . . are adjusted to be identical to the displacement amount of the reference vibrator.

Figure 9:
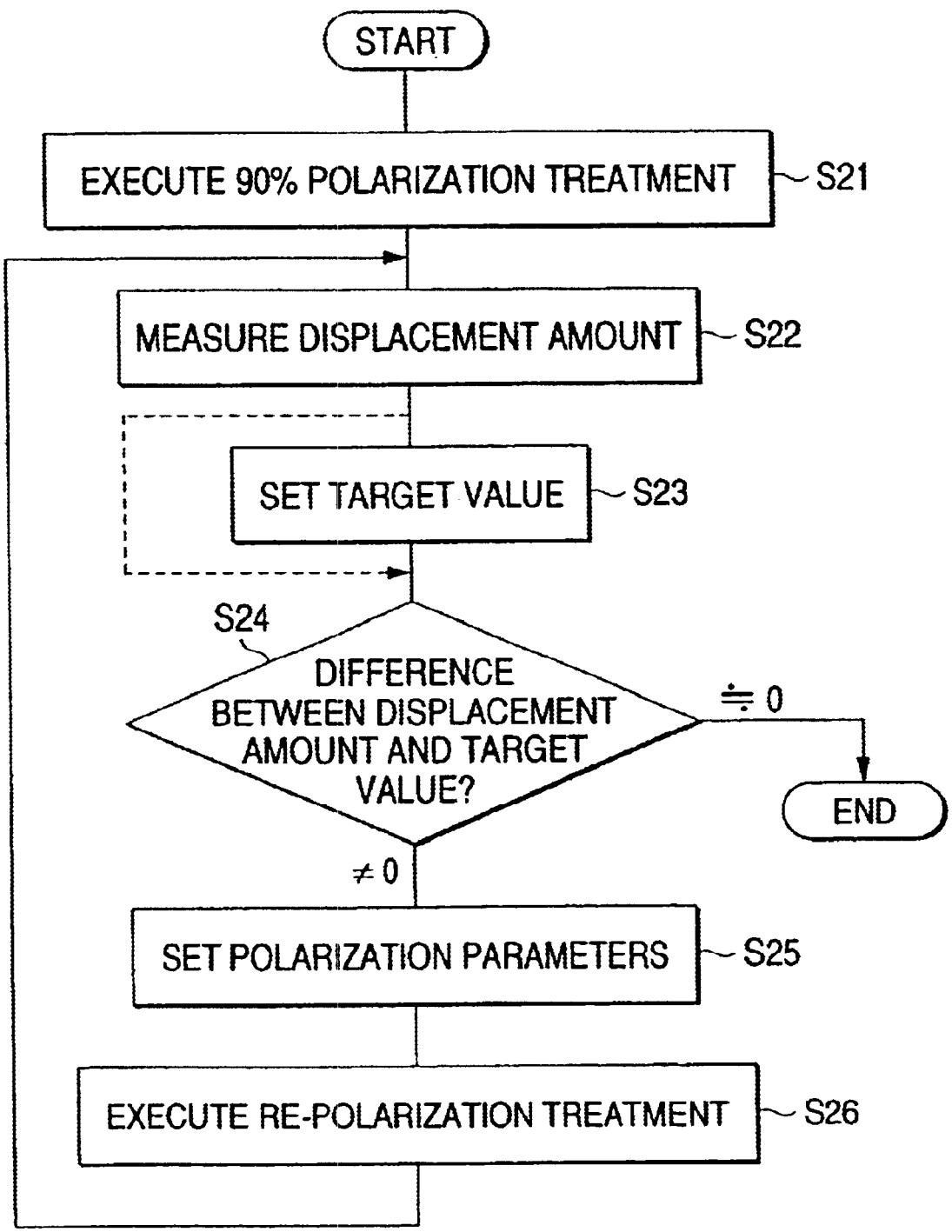
FIG. 9 is a flowchart to describe a displacement amount adjustment method based on polarization degree.

A displacement amount adjustment method will be discussed with reference to a flowchart of FIG. 9.

In this adjustment method, first, semi-saturation polarization treatment (S21) is executed for all drive vibrators 24B . . . , such that the drive vibrators 24B . . . are subjected to the polarization treatment but the polarization treatment is terminated before the piezoelectric material 29 is completely polarized, thereby putting the piezoelectric material 29 in a semi-saturation polarization state. In the embodiment, forward polarization voltage, i.e. voltage in the same direction as the vibrators are displaced, is applied to all drive vibrators 24B . . . until the piezoelectric material 29 is put into the polarization state of 90% of the saturation polarization state. Therefore, in the semi-saturation polarization treatment, a DC electric field is applied to the piezoelectric material 29 over a predetermined time.

The term "polarization state of 90% of the saturation polarization state" means the polarization state falling within the allowable range from a reference state, provided that the reference state is considered as 90% of the saturation (100%) polarization state. For example, the polarization state in the range of ±5% from the 90% polarization state (namely, 85% to 95%) is included in this term. If the semi-saturation polarization state is thus set, the remaining 10% can be assigned as the adjustment range (margin) in re-polarization treatment (S26) described later, so that necessary and sufficient adjustment can be made.

The higher the polarization treatment voltage value, the higher the polarization degree per unit time, and the longer the voltage applying time, the higher the polarization degree. Further, the higher the temperature of the drive vibrator 24B, the easier polarization. Thus, the voltage value, the voltage applying time, the vibrator temperature, and the like at the polarization treatment time are used as variables, the values are adjusted, and polarization treatment is executed, whereby the piezoelectric material 29 can be adjusted efficiently to any desired semi-saturation polarization state.

If the semi-saturation polarization treatment is executed, then a displacement amount measurement step (S22) is started. In this displacement amount measurement step, the displacement amounts of drive vibrators 24B . . . with respect to the reference voltage are measured separately. In the displacement amount measurement step, for example, the displacement speed of each drive vibrator 24B when the reference voltage is supplied is measured using a laser Doppler vibration meter, etc., and is integrated in the time direction, thereby calculating the displacement amount. The displacement amount may be measured directly using a laser displacement gage, etc.

If the displacement amounts of drive vibrators 24B . . . are measured, the target displacement amount is set (S23). Here, the target value of the displacement amount applied to all drive vibrators 24B . . . is set. Since each of the drive vibrators 24B . . . has a polarization margin of about 10% in the forward direction as described above, for example, the drive vibrator 24B having the maximum displacement amount is used as a reference vibrator, and the displacement amount of the reference vibrator is set as the target displacement amount.

The maximum displacement amount of the drive vibrator 24B is adopted as the target displacement amount, but the invention is not limited thereto. For example, the displacement amount larger than the displacement amount of the reference vibrator is set as the target displacement amount, and the displacement amount of each drive vibrator 24B may be adjusted to be identical to the target displacement amount. If the displacement amounts of other drive vibrators 24B . . . than the reference vibrator are adjusted to be identical to the displacement amount of the reference vibrator, the displacement amount adjustment can be minimized, thus resulting in good efficiency. If the displacement amount larger than the displacement amount of the reference vibrator is adopted as the target displacement amount, the displacement amount of each drive vibrator 24B can be set large.

If the target displacement amount is set, the treatment condition for each of the drive vibrators 24B . . . is set based on the measurement result by the displacement amount measurement step, and displacement amount adjustment is executed based on the setup treatment condition (displacement amount adjustment step). In the displacement amount adjustment step, first the treatment condition is set. In the embodiment, the displacement amount of each drive vibrator 24B is adjusted according to the polarization degree, and thus the re-polarization treatment condition is set as the treatment condition.

That is, a determination step (S24) is executed, which calculates the difference between the displacement amount of the drive vibrator 24B to be adjusted and the target displacement amount, and determines whether or not the difference falls within the allowable range. In the determination step, if the difference between the displacement amount and the target displacement amount is outside the allowable range, the program returns to a treatment condition setting step (S25) to adjust the corresponding drive vibrator 24B. If the difference between the displacement amount and the target displacement amount falls within the allowable range for all drive vibrators 24B . . . , the process is terminated.

The treatment condition setting step (S25) is a step for setting the re-polarization treatment conditions of the drive vibrator 24B to be adjusted based on the difference between the displacement amounts and the target displacement amount. This means that the re-polarization treatment parameters are set for the drive vibrator 24B to be adjusted. Here, the voltage value applied to the piezoelectric material 29, the applying time of voltage applied to the piezoelectric material 29, and the temperature of the piezoelectric material 29 are selected appropriately as the re-polarization treatment parameters (variables) for setting the re-polarization conditions.

The re-polarization treatment conditions may be set so that the drive vibrator of the resultant polarization state exhibit a displacement amount less than the target displacement amount. For example, using parameters obtained by multiplying by a coefficient of ½, the polarization state of the drive vibrator 24B may be gradually converged to the target polarization state providing the target displacement amount as the re-polarization treatment is repeated.

If the re-polarization treatment conditions are set, a re-polarization treatment step (a kind of displacement amount adjustment step, S26) is executed. In this re-polarization treatment, the voltage value applied to the piezoelectric material 29, the applying time of voltage applied to the piezoelectric material 29, the temperature of the piezoelectric material 29, and the like are set appropriately based on the re-polarization conditions set at the treatment condition setting step, and the re-polarization treatment is executed under the setup conditions.

After the re-polarization treatment is executed, control returns to the above-described displacement amount measurement step (S22), and the displacement amount of the drive vibrator 24B after the re-polarization is measured. If the displacement amount is measured, the target displacement amount setting step (S23) is skipped, and the difference between the measured displacement amount and the target displacement amount is determined, and if the difference falls within the predetermined allowable range, another drive vibrator 24B is adjusted.

According to the adjustment method, all drive vibrators 24B . . . (piezoelectric material 29) are put into the semi-saturation polarization state at the semi-saturation polarization step, and the piezoelectric material 29 of necessary drive vibrators 24D in the semi-saturation polarization state is again polarized in the forward direction to be adjusted into any desired polarization state. Since the polarization state is one direction to the saturation side, the piezoelectric material 29 can be easily adjusted into any desired polarization state.

Therefore, the displacement amounts of the drive vibrators 24B . . . are made uniform. Since the adjustment method is not an adjustment method of applying voltage in opposite polarity for inverting the polarization, the reliability of the adjustment is high and the adjustment is easy.

In the third embodiment, the example in which the piezoelectric material 29 of the drive vibrators 24B . . . is put into the semi-saturation polarization state and again polarized in the forward direction to have any desired identical polarization characteristic, has been described. However, the adjustment method of the third embodiment is not limited to this example. For example, the piezoelectric material 29 of the drive vibrators 24B . . . may be once put in the complete saturation polarization state and the drive vibrators 24B . . . in the complete saturation polarization state may be partially heated so that the piezoelectric material 29 is depolarized partially, thereby adjusting the displacement amounts of the drive vibrators 24B . . . as desired. A modified example of the third embodiment adopting such adjustment method will be discussed.

Figure 10:
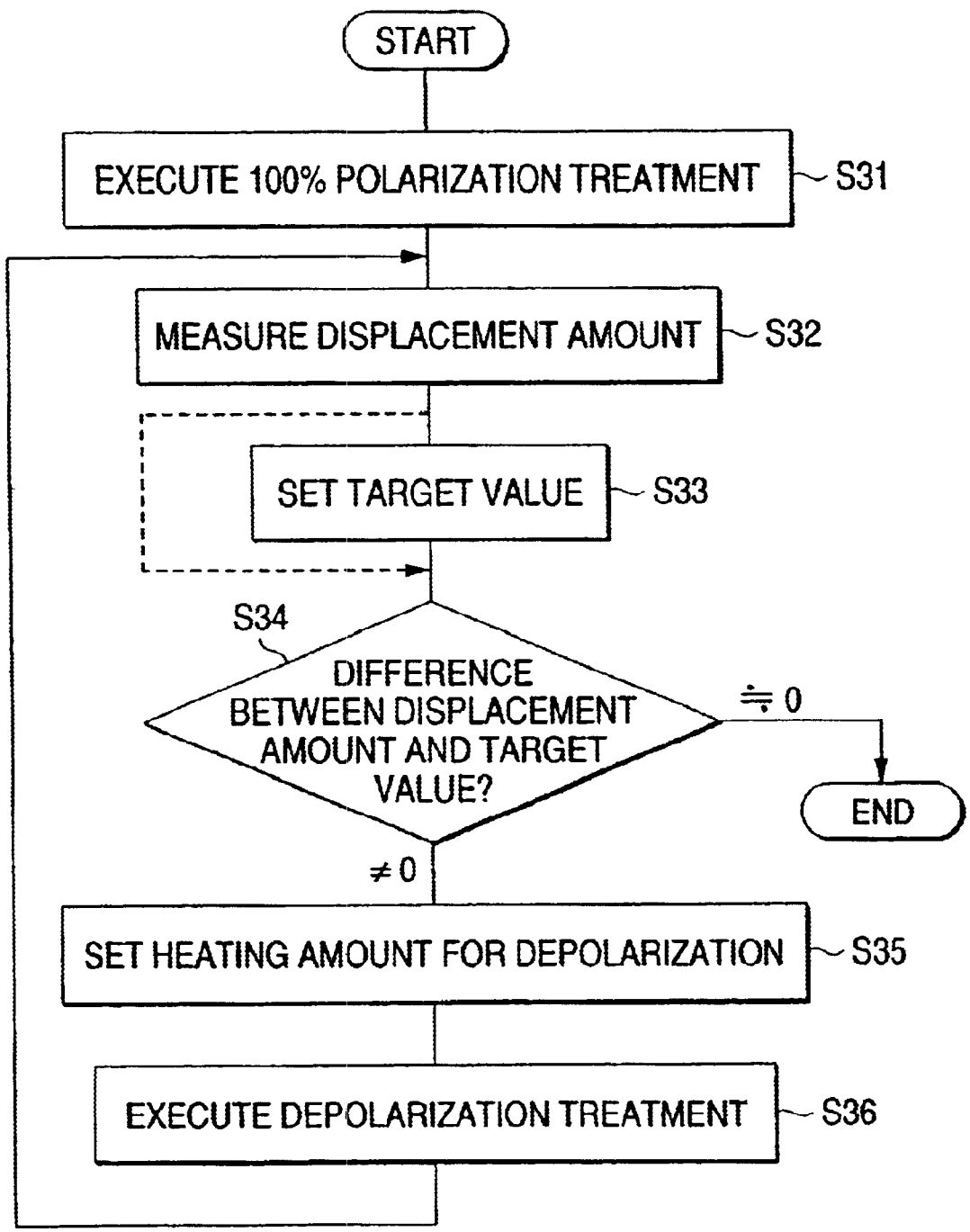
FIG. 10 is a flowchart to describe another displacement amount adjustment method based on polarization degree.

FIG. 10 is a flowchart for describing the adjustment method in the modified example. The configuration of recording head 1 and the manufacturing method other than the adjustment method are the same as those in the third embodiment and therefore will not be discussed again.

In the illustrated adjustment method, first a saturation polarization treatment step (S31) is executed. In the saturation polarization treatment step, all drive vibrators 24B . . . are polarized to complete saturation, and thus the piezoelectric material 29 is put into the complete saturation polarization state. That is, polarization voltage is applied between segment external electrodes 31 and common external electrodes 30 of all drive vibrators 24B . . . to apply a DC electric field to the piezoelectric material 29 until polarization is saturated.

Next, a displacement amount measurement step (S32) of measuring the displacement amounts of the drive vibrators 24B . . . in the saturation polarization state is executed. In the displacement amount measurement step, for example, a laser Doppler vibration meter, a laser displacement gage, etc., is used to measure the displacement amount of each drive vibrator 24B when the reference voltage is supplied, as in the third embodiment.

Next, a target displacement amount setting step (S33) is executed. Here, the target value of the displacement amount applicable to all drive vibrators 24B . . . is set based on the measurement data obtained by the measurement step. Since polarization of each drive vibrator 24B . . . is saturated, for example, the drive vibrator 24B having the minimum displacement amount is used as a reference vibrator, and the displacement amount of the reference vibrator is set as the target displacement amount.

If the target displacement amount is set, the treatment condition for each of the drive vibrators 24B . . . is set based on the measurement result at the displacement amount measurement step, and displacement amount adjustment is executed based on the setup treatment condition (displacement amount adjustment step). In the displacement amount adjustment step, first the treatment condition is set. In the modified example, the piezoelectric material 29 is partially depolarized by executing spot heating of the drive vibrator 24B so as to adjust the displacement amount of the drive vibrator 24B, and thus the spot heating condition is set as the treatment condition.

Therefore, first a determination step (S34) of calculating the difference between the displacement amount of the drive vibrator 24B to be adjusted and the target displacement amount, and determining whether or not the difference falls within the allowable range is executed. In the determination step, if the difference between the displacement amount and the target displacement amount is outside the allowable range, a treatment condition setting step (S35) is executed to adjust the corresponding drive vibrator 24B. If the difference between the displacement amount and the target displacement amount falls within the allowable range for all drive vibrators 24B . . . , the process is terminated.

The treatment condition setting step (S35) is a step for setting the spot heating condition for the drive vibrator 24B to be adjusted based on the difference between the displacement amount and the target displacement amount. This means that the heating condition for the drive vibrator 24B to be adjusted is set. Here, the spot heating area, the spot heating temperature, the spot heating time, and the like are set as the heating condition. The heating temperature is set to the temperature at which the piezoelectric material 29 is depolarized, preferably to the temperature equal to or higher than the Curie temperature of the piezoelectric material 29.

If the spot heating condition is set, a spot heating step (a kind of displacement amount adjustment step, S36) is executed. In this spot heating step, for example, a laser beam is applied locally to the piezoelectric material 29 based on the setup heating condition. The portion of the piezoelectric material 29 where the laser beam is irradiated is locally depolarized thermally, and the displacement amount of the drive vibrator 24B is decreased accordingly. In the spot heating step, local irradiation with infrared rays or local abutment of a heating terminal may be performed in place of the laser beam irradiation.

Upon completion of the spot heating step, control returns to the displacement amount measurement step (S32), and the displacement amount of the drive vibrator 24B after the spot heating is measured. If the displacement amount is measured, the target displacement amount setting step (S33) is skipped, and the difference between the measured displacement amount and the target displacement amount is determined (S34), and if the difference falls within the allowable range, another drive vibrator 24B is adjusted.

According to the adjustment method, all drive vibrators 24B . . . (piezoelectric material 29) are put into the saturation polarization state at the saturation polarization step, and the piezoelectric material 29 in the saturation polarization state is locally heated in the spot heating step for depolarizing the corresponding portion. Thus, the piezoelectric material 29 can be adjusted into any desired polarization state by performing simple operation of only heating. Therefore, the displacement amounts of the drive vibrators 24B . . . are easily made uniform.

The above-described re-polarization adjustment method and the spot heating adjustment method can also be used in combination.

In the modified example, first, in the semi-saturation polarization step (S21), polarization is stopped before saturation, and the piezoelectric material 29 of the piezoelectric vibrators 24B are put into the semi-saturation polarization state. Next, the displacement amounts of the drive vibrators 24B . . . are measured (S22), and the target displacement amount is set based on the measurement value (S23). If the target displacement amount is set, the difference between the displacement amount of the drive vibrator 24B to be adjusted and the target displacement amount is determined (S24), and the treatment conditions are set (S25, S35). In the condition setting step, if the displacement amount is less than the target displacement amount, the condition for re-polarizing the piezoelectric material 29 in the forward direction is set (S25) On the other hand, if the displacement amount is greater than the target displacement amount, the condition for spot heating the piezoelectric material 29 is set (S35). If the condition is set, a polarization adjustment step (a kind of displacement amount adjustment step) is executed. That is, the re-polarization treatment step (S26) or the spot heating step (S36) is selected based on the setup condition, and is executed. With this adjustment method, the displacement amount of drive vibrator 24B can be converged to the target displacement amount efficiently.

In the polarization treatment of the semi-saturation polarization step, the re-polarization step, and the saturation polarization step, the piezoelectric material 29 can be easily polarized in the forward direction (saturation direction) by heating the drive vibrator 24B. Since the piezoelectric material 29 forming a part of the drive vibrator 24B has a large dielectric loss, the temperature can be easily raised to about 100 degrees by vibrating the piezoelectric material 29 in the air at high speed.

Then, in the polarization treatment step (S21, S26, S31), before the polarization voltage is applied, a polarization drive signal for charging and discharging the piezoelectric material 29 alternately may be supplied to the drive vibrator 24B to be adjusted in order to raise the temperature of the drive vibrator 24B to a predetermined temperature or higher. According to this heating polarization treatment, the heat generated by the drive vibrator 24B itself makes it possible to execute efficient polarization in the polarization step following the heat generation.

If the heating polarization treatment is executed, the heating temperature, the temperature raising speed, etc., of the drive vibrator 24B can be controlled by appropriately setting the waveform of the polarization drive signal, namely, the crest value and the repetition cycle. Thus, the method is easy and a special heater, etc., is not required.

In the third embodiment and its modified example wherein the polarization degree is varied for adjusting the displacement amount of the drive vibrator 24B, the drive vibrator 24B is a piezoelectric vibrator in the so-called vertical vibration mode and is expanded and contracted in the direction orthogonal to the lamination direction of the piezoelectric material 29 by the action of an electric field. However, the adjustment method can also be applied to a piezoelectric vibrator in so-called horizontal vibration mode expanded and contracted in the lamination direction of piezoelectric material 29 by the action of an electric field. A modified example will be discussed.

Figure 11:
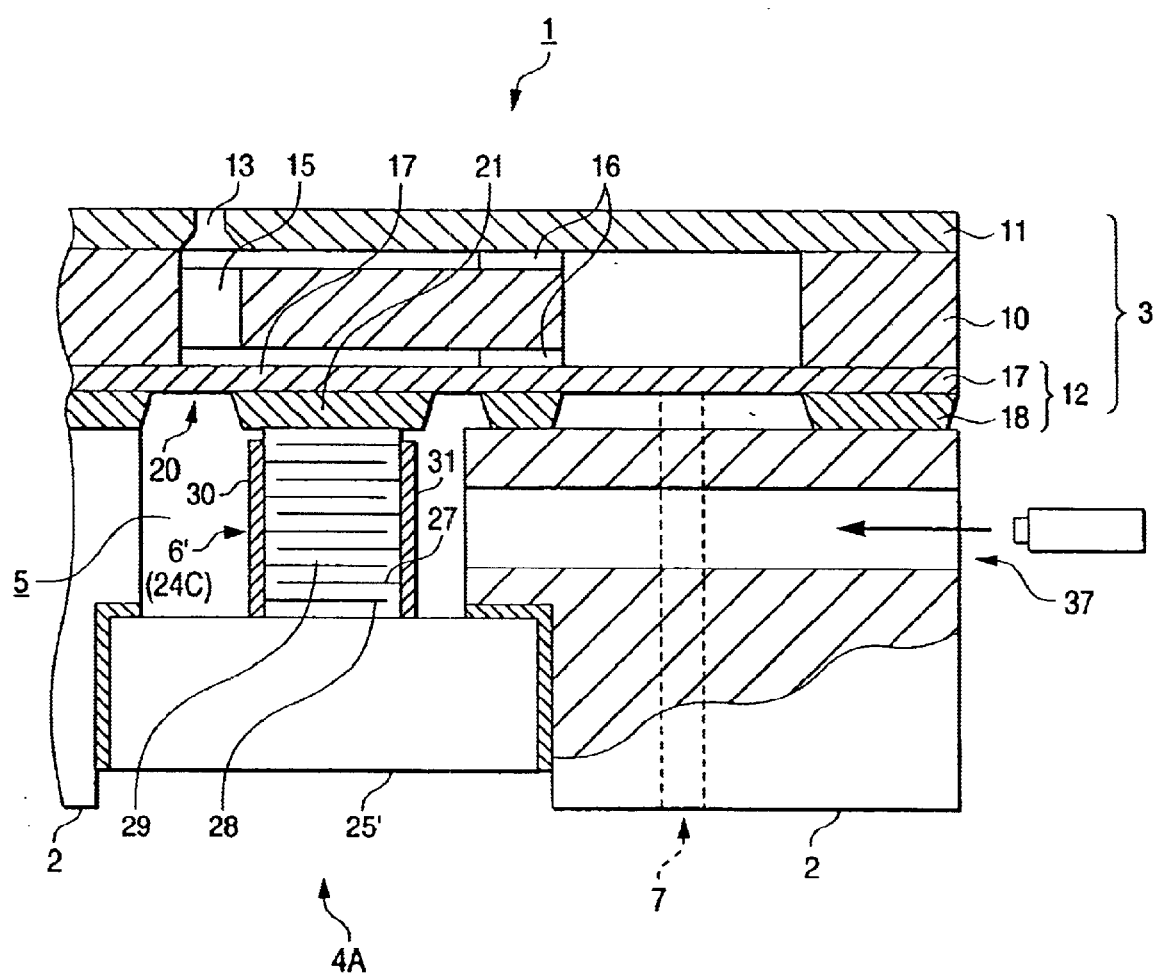
FIG. 11 is a sectional view to show the main part of a recording head using drive vibrators in a horizontal vibration mode on an enlarged scale.

In this modified example, a piezoelectric vibrator unit 4A in the horizontal vibration mode is used to form a part of a recording head 1, as shown in FIG. 11. This means that the recording head 1 has the piezoelectric vibrator unit 4A housed in the storage space 5 of the case 2. Drive vibrators 24C of the piezoelectric vibrator unit 4A cause pressure change of pressure chambers 15 . . . in a flow passage unit 3 for ejecting ink droplets from nozzle openings 13 . . . , respectively. Components identical or similar to those previously described with reference to the accompanying drawings are denoted by the same reference numerals in FIG. 11, and will not be discussed again.

The piezoelectric vibrator unit 4A is mainly made up of a vibrator group 6', a fixing plate 25', etc. The vibrator group 61 is formed such that piezoelectric material 29 and electrode layers (common internal electrodes 27, segment internal electrodes 28) are alternately laminated to provide a laminate substrate, external electrode 30, 31 are formed on the surfaces of the laminate substrate to provide a laminate member, and laminate member is cut to have separate teeth of comb with slits at predetermined pitches corresponding to the pressure chambers 15 . . . defined in the flow passage unit 3.

The vibrator group 6' differs from the above-described vibrator group 6 in shape and placement direction, and the surface of the lamination side is joined to the fixing plate 25'. The common external electrode 30 and the segment external electrode 31 are disposed on the opposed sides of the drive electrode 24C. In the piezoelectric vibrator unit 4A, the surface of the piezoelectric material 29 at the leading end becomes the leading end surface part of the corresponding drive vibrator 24A, and the leading end surface part is jointed to the corresponding island part 21 of an elastic plate 12.

A potential difference is given between the opposed internal electrodes 27 and 28 to displace (expands or contracts) the corresponding drive vibrator 24C in the lamination direction of the piezoelectric material 29 to thereby displace the corresponding diaphragm part 20 partitioning the corresponding pressure chamber 15. As the diaphragm part 20 is displaced, the pressure chamber 15 is expanded or contracted, and pressure change occurs in ink in the pressure chamber 15 for ejecting an ink droplet from the corresponding nozzle opening 13.

In the third embodiment wherein the polarization degree of each piezoelectric material 29 is adjusted, the polarization degree is adjusted based on the displacement amount of the drive vibrator 24B (24C), but the invention is not limited to the method. For example, polarization degree adjustment (displacement amount adjustment) may be applied to the assembled recording head 1.

A fourth embodiment adopting this method will be discussed.

Also in a manufacturing method of the fourth embodiment, first a piezoelectric vibrator unit 4 is manufactured as in the second embodiment described above. That is, the common internal electrodes 27 and the segment internal electrodes 28 are laminated alternately with the piezoelectric material 29 interposed between adjacent internal electrodes so that the active region is formed in the free end part 24a, thereby manufacturing a plate-like laminate substrate. The segment external electrode 31 and the common external electrode 30 are formed on the surface of the laminate substrate, thereby manufacturing a laminate member provided with the external electrodes. If the laminate member is manufactured, the fixing plate 25 is joined to the fixing plate attachment surface of the laminate member, and the laminate member is cut to have teeth of comb, i.e. the plurality of piezoelectric vibrators 24B and 26.

If the piezoelectric vibrator unit 4 is manufactured, the case 2 and the flow passage unit 3 separately manufactured are joined to each other, and the piezoelectric vibrator unit 4 is housed inside the joint assembly, i.e. within the storage space 5.

Figure 12:
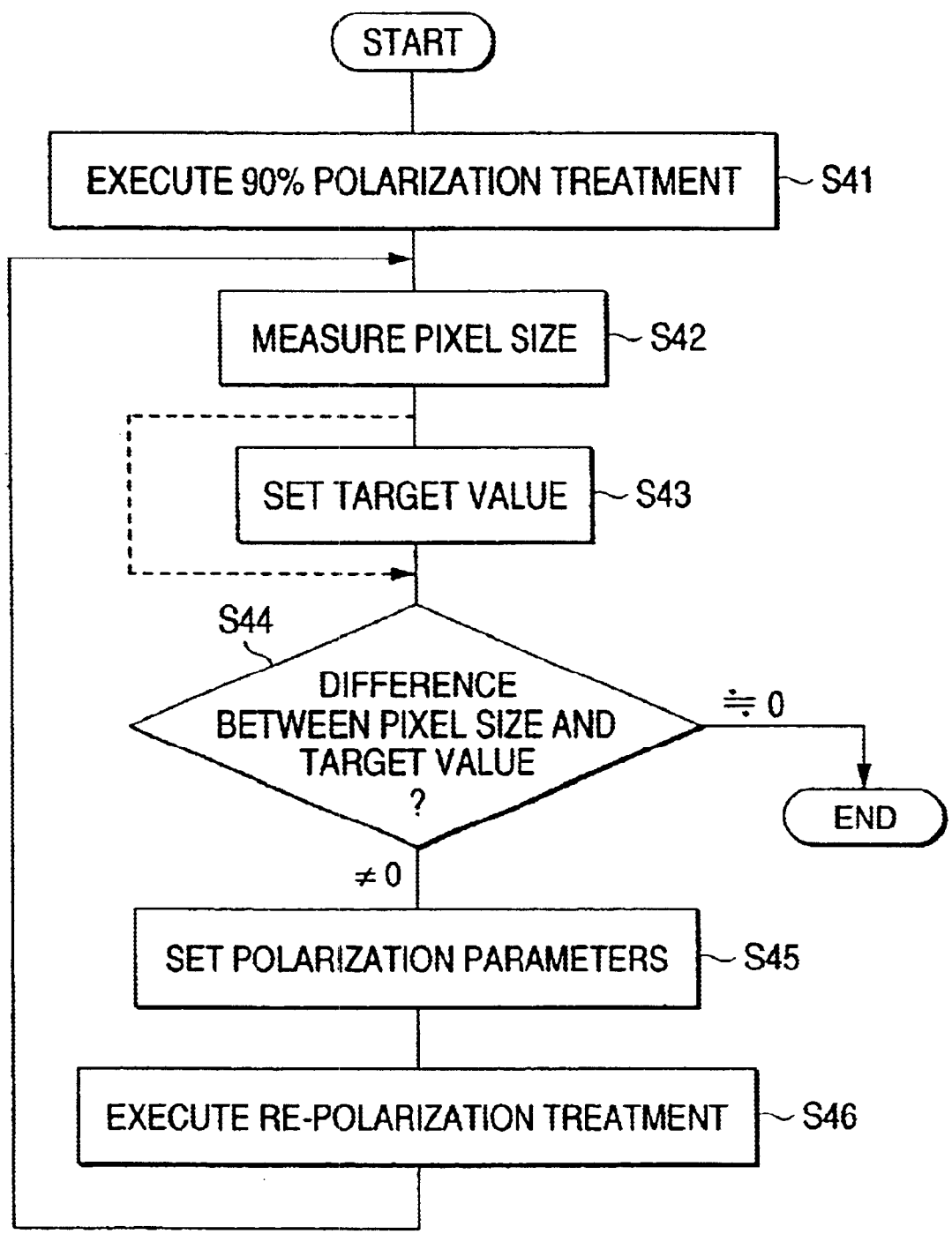
FIG. 12 is a flowchart to describe a displacement amount adjustment method based on pixel size.
Figure 13:
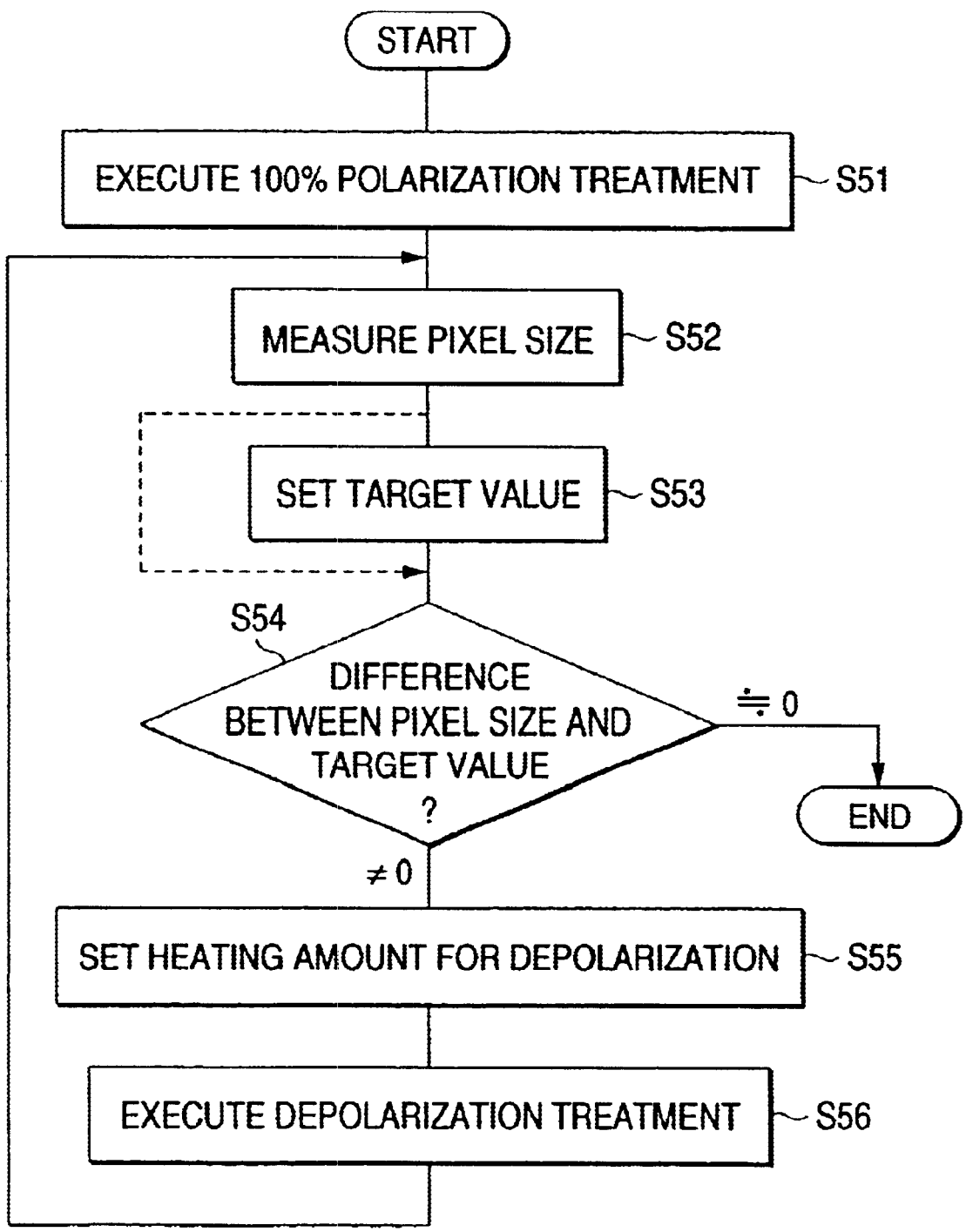
FIG. 13 is a flowchart to describe another displacement amount adjustment method based on pixel size.

If the piezoelectric vibrator unit 4 is housed within the storage space 5, the liquid ejection characteristics of nozzle openings 13 . . . are adjusted. This adjustment method is executed according to a procedure shown in a flowchart of FIG. 12, which includes an ejection characteristic measurement step and an ejection characteristic adjustment step.

The ejection characteristic measurement step, like that in the second embodiment, is a step at which the ink droplet ejection characteristic is measured for each of the nozzle openings 13 . . . In the fourth embodiment, the size of each pixel formed as a consequence of ejecting an ink droplet onto a printing or recording medium (namely, the area of the ejected ink droplet) is measured as the ink ejection characteristic.

Prior to the measurement, first a semi-saturation polarization step (S41) is executed. This means that a DC electric field is appropriately applied to all drive vibrators 24B for polarizing all drive vibrator 24B to a semi-saturation state.

If the drive vibrators 24B are polarized to the semi-saturation state, a pixel measurement step (S42) is executed. In this pixel measurement step, first, the same drive signal is applied to all drive vibrators 24B . . . for ejecting ink droplets from the nozzle openings 13, thereby forming pixels on a printing or recording medium. If the pixels are formed, then the size of each pixel, namely, the area of ejected ink on the printing or recording medium is measured.

If each pixel size is measured, the ejection characteristic adjustment step is executed. In this ejection characteristic adjustment step, first, a target value setting step (S43) is executed so that the target value of the pixel size applicable to all drive vibrators 24B . . . is set. since this manufacturing method adopts re-polarization for adjusting the displacement amount of the drive vibrator 24B, the size of the largest pixel is set to the target value (ejection characteristic), and the displacement amounts of other drive vibrators 24B are adjusted, so that the size of each pixel is adjusted to be identical to the largest pixel size.

If the target value is set, a determination step (S44) is executed. Whether or not the difference between the size of the pixel recorded using the drive vibrator 24B to be adjusted and the largest pixel size falls within a predetermined allowable range is determined. If the difference is within the allowable range, the adjustment to the drive vibrator 24B is terminated, and whether or not adjustment to another drive vibrator 24B is to be executed is determined.

If it is determined at the determination step that the difference is outside the allowable range, a treatment condition setting step (S45) is executed, and condition in a re-polarization step (a kind of displacement amount adjustment step, S46) is set. Here, the voltage value applied to the piezoelectric material 29, the applying time of voltage applied to the piezoelectric material 29, and the temperature of the piezoelectric material 29 are selected appropriately as the re-polarization treatment parameters (variables) for setting the re-polarization condition so that the pixel size becomes the target value.

If the condition is set, a re-polarization step (S46) is executed so that the piezoelectric material 29 is again polarized in the forward direction based on the setup condition.

If the re-polarization step is executed, control returns to the pixel measurement step (S42) and the size of the pixel formed using the piezoelectric vibrator 24B after undergoing the re-polarization is measured. If the pixel size is measured, the target value setting step (S43) is skipped, and the above-described steps are executed repeatingly. If the difference between the measured pixel size and the target value falls within the predetermined allowable range, the adjustment to the drive vibrator 24B is terminated, and whether or not adjustment to another drive vibrator 24B is to be executed is determined (S44).

According to this adjustment method, the polarization state of the drive vibrator 24B is adjusted based on the actual size of pixel formed by the ejected ink droplet. Therefore, variation in ink ejection characteristic, which is caused not only by varying displacement amount of the drive vibrator 24B but also by varying size of the nozzle opening 13, varying shape of the pressure chamber 15, etc., can be corrected totally. That is, adjustment can be executed in the operating state of the recording head 1, and the characteristic of the ink droplet ejected from the nozzle openings 13 . . . can be made uniform at a remarkably high level.

Since the displacement amounts are adjusted at the last stage of the manufacturing step of the recording head 1, there is no risk that the displacement amount of each drive vibrator 24B may be changed after the adjustment. Therefore, any additional, wasteful steps, such as re-adjustment, etc., can be dispensed with, and the manufacturing can be made efficient.

The adjustment method of the fourth embodiment is to execute the re-polarization step for adjusting the polarization degree of each piezoelectric material 29, but the spot heating may be executed for adjusting the polarization degree. In this case, preferably an adjustment opening for communication between the storage space 5 and the outside of the case 2 is formed through the case 2, for example, as shown in FIG. 11. The adjustment opening enables a vibrator group 6' housed in the storage space 5 to be accessed from the outside of the case 2, and the spot heating of each drive vibrator 24C can be executed through the adjustment opening. A modified example of the fourth embodiment adopting this method will be discussed.

Also in an adjustment method of the modified example, a piezoelectric vibrator unit 4 is manufactured as in the fourth embodiment. Next, a flow passage unit 3 and a case 2 separately manufactured are joined to each other, and the piezoelectric vibrator unit 4 is fixedly housed in a storage space 5.

If the piezoelectric vibrator unit 4 is fixedly housed in the storage space 5, the liquid ejection characteristics of nozzle openings 13 . . . are adjusted. This adjustment method includes an ejection characteristic measurement step and an ejection characteristic adjustment step.

In the ejection characteristic measurement step, first, a saturation polarization step (S51) is executed. This means that a DC electric field is applied to all drive vibrators 24C for polarizing all drive vibrators 24C to a saturation state. If the drive vibrators 24C are polarized to the saturation state, a pixel measurement step (S52) is executed. This pixel measurement step is executed in a similar manner to that at step S42 described above. That is, first, the drive signal of the same waveform is applied to all drive vibrator 24C . . . for ejecting ink droplets from the respective nozzle opening 13, thereby forming pixels on a printing or recording medium. Next, the size of each pixel, namely, the area of ink ejected onto the printing or recording medium is measured.

If each pixel size is measured, a target value setting step (S53) is executed so that the target value of the pixel size applicable to all drive vibrators 24C . . . is set. Since this method adopts the spot heating for adjusting the polarization degree, the size of the smallest pixel is set to the target value (ejection characteristic), the displacement amounts of other drive vibrators 24C . . . are adjusted so that the size of each pixel is made identical to the smallest pixel size.

If the target value is set, a determination step (S54) is executed. Whether or not the difference between the size of the pixel recorded using the drive vibrator 24C to be adjusted and the smallest pixel size is within a predetermined allowable range is determined. If the difference is within the allowable range, the adjustment to the drive vibrator 24C is terminated and whether or not adjustment to another drive vibrator 24C is to be executed is determined.

If it is determined at the determination step that the difference is outside the allowable range, a treatment condition setting step (S55) is executed so that condition in a spot heating step (a kind of displacement amount adjustment step, S56) is set. Here, the spot heating area, the spot heating temperature, the spot heating time, and the like are set as the heating conditions for adjusting the pixel size to be identical to the target value.

If the condition is set, a spot heating step (depolarization step, S56) is executed for the drive vibrator 24C to be adjusted. In this spot heating step, for example, a laser beam or infrared ray is locally applied to piezoelectric material 29 or a heating terminal is abutted against the piezoelectric material 29, from the outside of the case 2 through the adjustment opening. The heated portion is depolarized, and the displacement amount of the drive vibrator 24C is decreased accordingly.

After the spot heating step is executed, control returns to the pixel measurement step (S52), and the size of the pixel formed using the piezoelectric vibrator 24C after undergoing the spot heating is measured. If the pixel size is measured, the target value setting step (S53) is skipped, and whether or not the difference between the measured pixel size and the target displacement amount is within the predetermined allowable range is determined. If the difference is within the predetermined allowable range, adjustment to another drive vibrator 24C is executed.

Also in the adjustment method, the polarization state of the drive vibrator 24C is adjusted based on the actual size of pixel formed by the ejected ink droplet. Accordingly, the variation in ejection characteristic, which is caused not only by varying displacement amount of the drive vibrator 24C but also by varying size of the nozzle opening 13, varying shape of the pressure chamber 15, etc., can be corrected totally. That is, adjustment can be executed in the operating state of the recording head 1, and the characteristic of the ink droplets ejected from the nozzle openings 13 . . . can be made uniform at a remarkably high level.

Since the displacement amounts are adjusted at the last stage of the manufacturing step, there is few possibility that the displacement amount of each drive vibrator 24C may be changed after the adjustment. Therefore, any additional, wasteful steps, such as re-adjustment, etc., can be dispensed with, and manufacturing can be made efficient.

At the pixel measurement steps (S42 and S52) described above, the pixel size is measured as the ink droplet ejection characteristic, but the invention is not limited to the method. For example, at these steps, the ejection speed of each of ink droplets ejected from the nozzle openings 13 . . . may be measured, and the condition for the re-polarization step (S46) and the condition for the spot heating step (S56) may be set based on the measured ejection speed. The ink amount ejected from each of the nozzle openings 13 . . . may be measured and the condition for the re-polarization step (S46) and the condition for the spot heating step (S56) may be set based on the measured ink amount.

The methods of the third and fourth embodiments are methods of changing the polarization degree of the piezoelectric material 29, thereby adjusting the displacement amount of the drive vibrator 24B, 24C. These methods can also be applied to a liquid jet head in which a piezoelectric vibrator (piezoelectric vibrator of so-called deflection vibration mode) is provided directly in the diaphragm part 20 of the pressure chamber 15.

In each of the above-described embodiments, the ink jet recording head 1 used in an image recording apparatus has been taken as an example of a liquid jet head. The scope of the invention is not limited to the recording head 1. For example, the invention can also be applied to liquid jet heads designed for industrial machines including, but not limited to, an optical filter manufacturing apparatus, a stamping or marking apparatus, and a microdispenser. The liquid jet heads, each of which uses highly durable piezoelectric vibrators, can be used stably over a long term.

As described above, according to the invention, the following advantages are provided: The piezoelectric vibrator unit of the invention is manufactured through the displacement amount measurement step of measuring the displacement amount of each of the piezoelectric vibrators with respect to the reference voltage, and the displacement amount adjustment step of setting a treatment condition for each piezoelectric vibrator based on the measurement result by the displacement amount measurement step and executing displacement amount adjustment based on the setup condition for making the displacement amounts of the piezoelectric vibrators uniform. Thus, the displacement amounts of the piezoelectric vibrators can be made uniform, and accordingly, the liquid ejection characteristic of the liquid jet head can be made uniform.

Since the displacement amounts are adjusted after the separate piezoelectric vibrators are obtained, the displacement amount of each piezoelectric vibrator is less likely to be changed after the adjustment is low. Therefore, additional, wasteful steps, such as re-adjustment, etc., can be dispensed with, and manufacturing can be made efficient.

Further, even the piezoelectric vibrator unit which had to be handled as being defective formerly can be mounted on a product after being subjected to the adjustment. Accordingly, the manufacturing yield can also be raised.

If the displacement amount adjustment is trimming treatment of trimming a portion of the active region of the external electrode in each piezoelectric vibrator, the displacement amount of each piezoelectric vibrator can be adjusted to any desired displacement amount depending on how the operational range of the outermost piezoelectric material is given. Thus, the displacement amounts of the piezoelectric vibrators can be made uniform. Since the displacement amounts of the piezoelectric vibrators are made uniform, the ejected ink droplet amounts can be made uniform with good accuracy among the nozzle openings, and the image quality can be enhanced.

If the trimming treatment is to trim the portion of the active region of the external electrode by executing laser beam machining, the trimming can be easily accomplished with high accuracy.

When the outermost piezoelectric material is made thicker than any other piezoelectric material, the thick outermost piezoelectric material protects the internal electrodes even if the trimming reaches the thick outermost piezoelectric material. Accordingly, the piezoelectric vibrator unit can be mounted to a product reliably. Therefore, the manufacturing yield of the piezoelectric vibrator unit can be raised.

If prior to the displacement amount measurement step, semi-saturation polarization treatment in which polarization is stopped before saturation to put the piezoelectric material in a semi-saturation polarization state, is executed, and the displacement amount adjustment is executed by re-polarization treatment of again polarizing the piezoelectric material of the semi-saturation polarization state in the forward direction, the polarization direction becomes one direction to the saturation side. Thus, the piezoelectric material can be easily adjusted into any desired polarization state. Therefore, the displacement amounts of the piezoelectric vibrators can be easily made uniform, and manufacturing can be made efficient. In this method, the physical shape of each piezoelectric vibrator before the adjustment and that after the adjustment do not change and thus also in this point, the displacement amounts of the piezoelectric vibrators can be reliably made uniform.

If the semi-saturation polarization state is set to a polarization state of 90% of the saturation polarization state, adjustment is easy, and a necessary and sufficient margin can be provided.

If prior to the displacement amount measurement step, saturation polarization treatment of executing polarization to saturation to put the piezoelectric material in the saturation polarization state is executed, and the displacement amount adjustment is executed by spot heating of locally heating the piezoelectric material of the saturation polarization state, the heated portion is locally depolarized. Accordingly, the piezoelectric material can be adjusted in any desired polarization state. The heating temperature in the heated portion and the heated portion area can be changed, to change the depolarization degree and the depolarized portion area. Accordingly, fine adjustment can also be realized. Thus, the displacement amounts of the piezoelectric vibrators can be made uniform easily and precisely. In this method, the physical shape of each piezoelectric vibrator before the adjustment and that after the adjustment do not change, and thus also in this point, the displacement amounts of the piezoelectric vibrators can be reliably made uniform.

If the displacement amount adjustment is executed by heating polarization adjustment of supplying a polarization drive signal to the electrode for charging and discharging the piezoelectric material alternately for causing the piezoelectric vibrator to generate heat by itself and polarizing the piezoelectric material of the heat generation state of the piezoelectric vibrator, the piezoelectric vibrator can be heated without providing a heating unit. Further, the piezoelectric vibrator to be adjusted can be selectively heated.

The liquid jet head of the invention is manufactured through the ejection characteristic measurement step of measuring the ejection characteristic of liquid ejected from the nozzle openings by applying the same drive signal to all piezoelectric vibrators for each of the nozzle openings, and the ejection characteristic adjustment step of setting a treatment condition for each piezoelectric vibrator based on the measurement result at the ejection characteristic measurement step and making displacement amount adjustment to the piezoelectric vibrators based on the setup condition for making the liquid ejection characteristics of the nozzle openings uniform. Thus, the liquid ejection characteristics of the nozzle openings can be made uniform.

At this time, adjustment can also be made to variation factors other than the drive vibrators. For example, variations in the joint state of the drive vibrator to the island part, variations in size of the nozzle opening, variations in shape of the pressure chamber, etc., can also be corrected. Since the displacement amounts are adjusted at the last stage of the manufacturing step of the recording head, wasteful steps, such as re-adjustment, etc., can be dispensed with, and manufacturing can be made efficient.

Further, even a liquid jet head which had to be handled as being defective formerly can be mounted on a product after being subjected to the adjustment, and the manufacturing yield can be raised.

If the piezoelectric vibrators are manufactured by laminating piezoelectric material and internal electrodes alternately to provide a laminate substrate, forming an electrode layer on the surface of the laminate substrate to provide a laminate member having an external electrode, and cutting the laminate member to have the piezoelectric vibrators in the form of teeth of comb, the displacement amount of each piezoelectric vibrator can be adjusted in the state of the finished product of the vibrator unit. Therefore, the adjustment can be conducted easily and reliably, and the piezoelectric vibrator unit manufacturing yield can be raised.

What is claimed is:

1. A manufacturing method of manufacturing a liquid jet head comprising a plurality of piezoelectric vibrators, each having, at least in part, a laminate structure of electrodes and at least one layer of piezoelectric material, and a plurality of liquid flow passages respectively for communication from a reservoir through pressure chambers to nozzle openings associated with the piezoelectric vibrators, wherein deformation of a piezoelectric vibrator causes deformation of a respective pressure chamber and changes liquid pressure in the respective pressure chamber to thereby eject liquid from a respective nozzle opening, the manufacturing method comprising:

an ejection characteristic measurement step for measuring an ejecting characteristic of each piezoelectric vibrator by applying a same drive signal to all the piezoelectric vibrators, and measuring liquid ejection characteristic one-by-one of the nozzle openings, a treatment condition setting step for setting a treatment condition for each of the piezoelectric vibrators based on a measurement result of the ejecting characteristic measurement step, an ejection characteristic adjustment step for adjusting an ejecting characteristic of each nozzle openings by executing a treatment based on a result of the treatment condition setting step, wherein the laminate structure includes an external electrode as an outermost one of the electrodes in a laminate direction, and an internal electrode that is to be different in polarity from the external electrode and that is confronted with the external electrode through the layer of the piezoelectric material to form an active region, and wherein the ejection characteristic adjustment step includes a step of trimming a portion of the external electrode of at least one piezoelectric vibrator, the portion being located within the active region.

2. The manufacturing method of claim 1, wherein the liquid ejection characteristic includes a liquid ejection amount.

3. The manufacturing method of claim 1, wherein the liquid ejection characteristic includes a liquid ejection speed.

4. The manufacturing method of claim 1, wherein the liquid ejection characteristic includes an area of ejected liquid on an object.

* * * * *